(12) United States Patent
Kim et al.

(10) Patent No.: US 9,449,992 B2
(45) Date of Patent: Sep. 20, 2016

(54) DISPLAY APPARATUS HAVING TOUCH SENSING PART AND METHOD OF MANUFACTURING THE SAME

(71) Applicant: SAMSUNG DISPLAY CO., LTD., Yongin, Gyeonggi-Do (KR)

(72) Inventors: Incheol Kim, Chungcheongnam-do (KR); Youngjoon Cho, Gyeonggi-do (KR); Seongmo Hwang, Gyeonggi-do (KR); Seungho Nam, Gyeonggi-do (KR); Sooguy Rho, Gyeonggi-do (KR); Sunghwan Won, Seoul (KR); Hyun-Ju Lee, Seoul (KR); Won-ki Hong, Gyeonggi-do (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 14/700,610

(22) Filed: Apr. 30, 2015

(65) Prior Publication Data

US 2015/0236047 A1 Aug. 20, 2015

Related U.S. Application Data

(62) Division of application No. 13/771,672, filed on Feb. 20, 2013, now abandoned.

(30) Foreign Application Priority Data

Apr. 12, 2012 (KR) ........................ 10-2012-0038081

(51) Int. Cl.
*G02F 1/1335* (2006.01)
*H01L 27/12* (2006.01)
(Continued)

(52) U.S. Cl.
CPC ............. *H01L 27/124* (2013.01); *G06F 3/041* (2013.01); *H01L 27/1262* (2013.01); *G02F 1/136209* (2013.01)

(58) Field of Classification Search
CPC ..................... G02F 1/13338; G02F 1/133512; G02F 1/136209; G06F 3/03547; G06F 3/041
See application file for complete search history.

(56) References Cited

U.S. PATENT DOCUMENTS

2006/0017710 A1 1/2006 Lee et al.
2007/0097278 A1 5/2007 Rho et al.
(Continued)

FOREIGN PATENT DOCUMENTS

JP 2009-251110 10/2009
JP 2011-191639 9/2011
(Continued)

OTHER PUBLICATIONS

European Search Report dated May 11, 2016 from the European Patent Office in respect to European Patent Application No. 13161996.7.

*Primary Examiner* — Paisley L Arendt
(74) *Attorney, Agent, or Firm* — F. Chau & Associates, LLC

(57) ABSTRACT

A display apparatus includes a first base substrate, a touch sensing part provided on the first base substrate, an electronic device provided on the first base substrate, a black matrix provided on the first base substrate, a signal line provided on the black matrix to apply a driving signal to the electronic device, a second base substrate facing the first base substrate, and a liquid crystal layer disposed between the first base substrate and the second base substrate.

8 Claims, 41 Drawing Sheets

(51) Int. Cl.
*G06F 3/041* (2006.01)
*G02F 1/1362* (2006.01)

(56) References Cited

U.S. PATENT DOCUMENTS

| | | |
|---|---|---|
| 2007/0195029 A1 | 8/2007 | Jeon et al. |
| 2008/0062139 A1 | 3/2008 | Hotelling et al. |
| 2008/0062148 A1 | 3/2008 | Hotelling et al. |
| 2008/0074401 A1 | 3/2008 | Chung et al. |
| 2009/0051842 A1 | 2/2009 | Kim et al. |
| 2010/0001973 A1 | 1/2010 | Hotelling et al. |
| 2010/0295804 A1 | 11/2010 | Takeuchi et al. |
| 2011/0001723 A1 | 1/2011 | Fan |
| 2011/0012115 A1 | 1/2011 | Jeon et al. |
| 2011/0074727 A1 | 3/2011 | Kim |
| 2011/0187671 A1 | 8/2011 | Huang |
| 2011/0227858 A1 | 9/2011 | An et al. |
| 2011/0279763 A1* | 11/2011 | Cho .................... G02F 1/13338 349/139 |
| 2011/0316809 A1 | 12/2011 | Kim et al. |

FOREIGN PATENT DOCUMENTS

| | | |
|---|---|---|
| KR | 1020040001324 A | 1/2004 |
| KR | 1020080012594 A | 2/2008 |
| KR | 1020090052240 A | 5/2009 |
| KR | 1020100117854 A | 11/2010 |
| KR | 1020120069978 | 6/2012 |
| KR | 1020130050446 | 5/2013 |
| KR | 1020130080319 | 7/2013 |

* cited by examiner

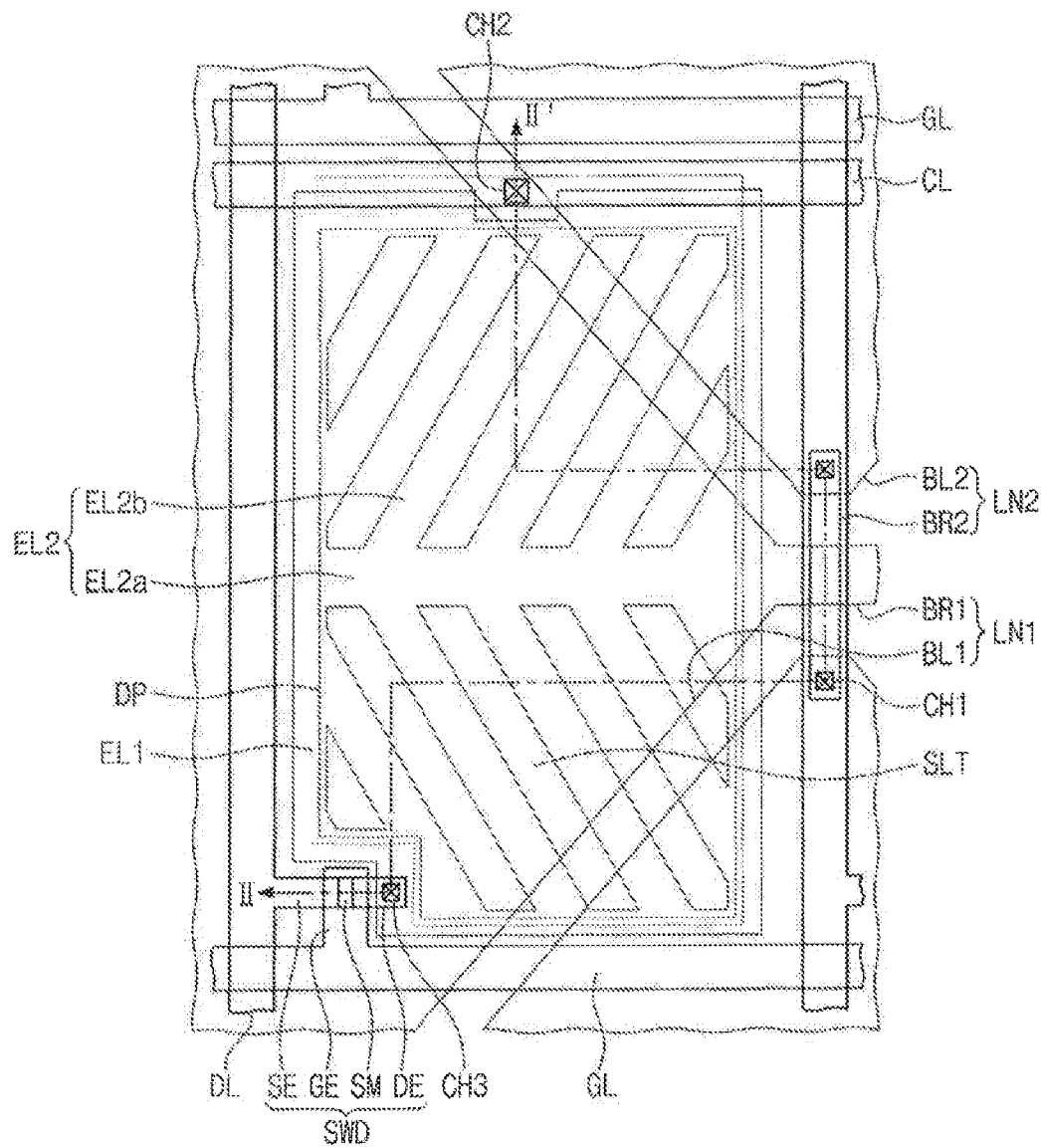

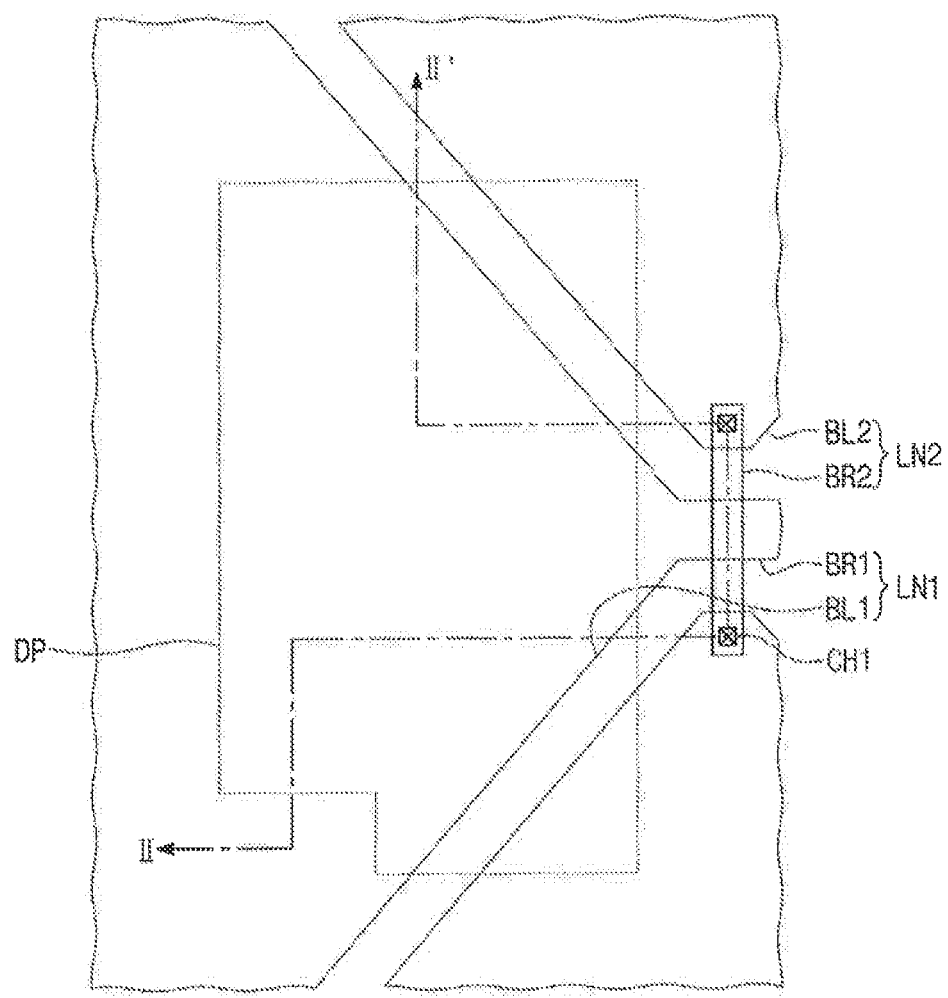

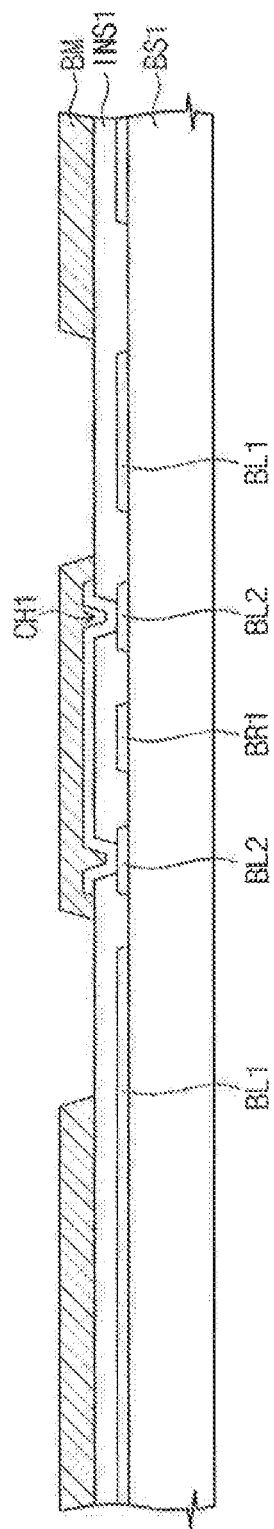

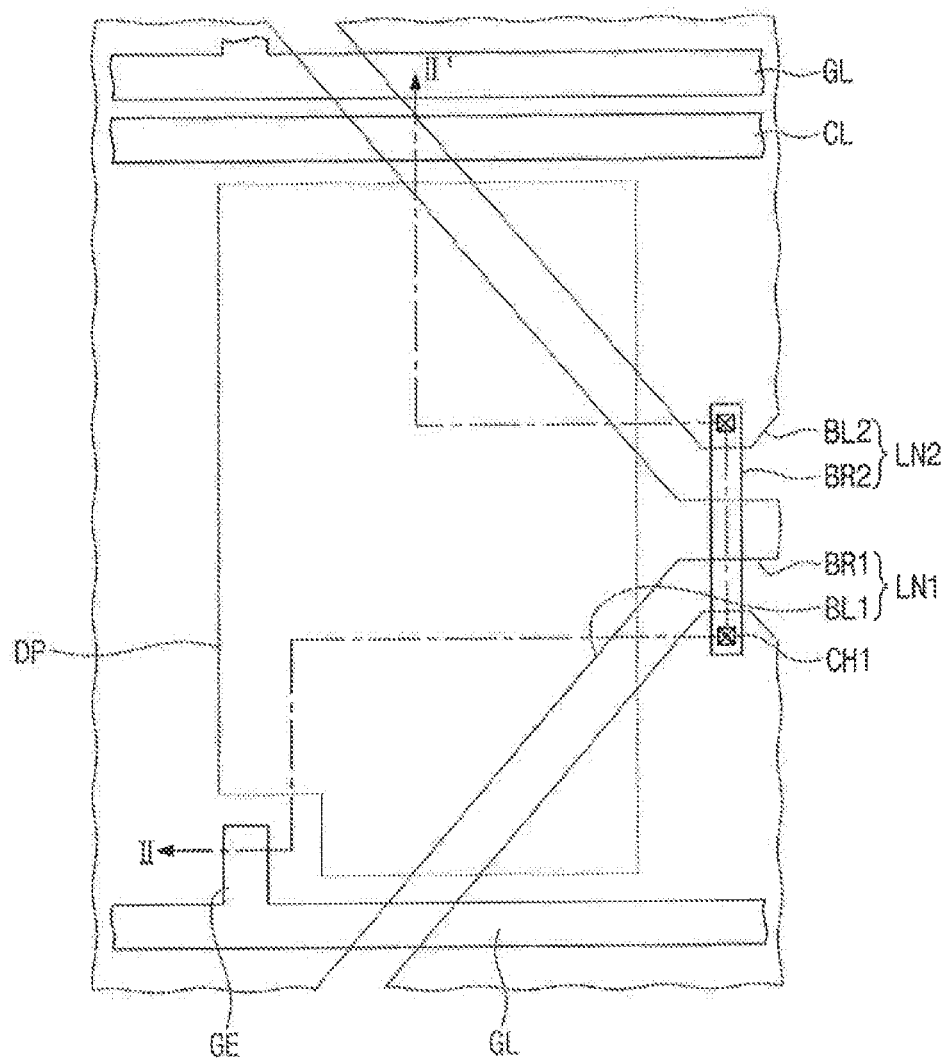

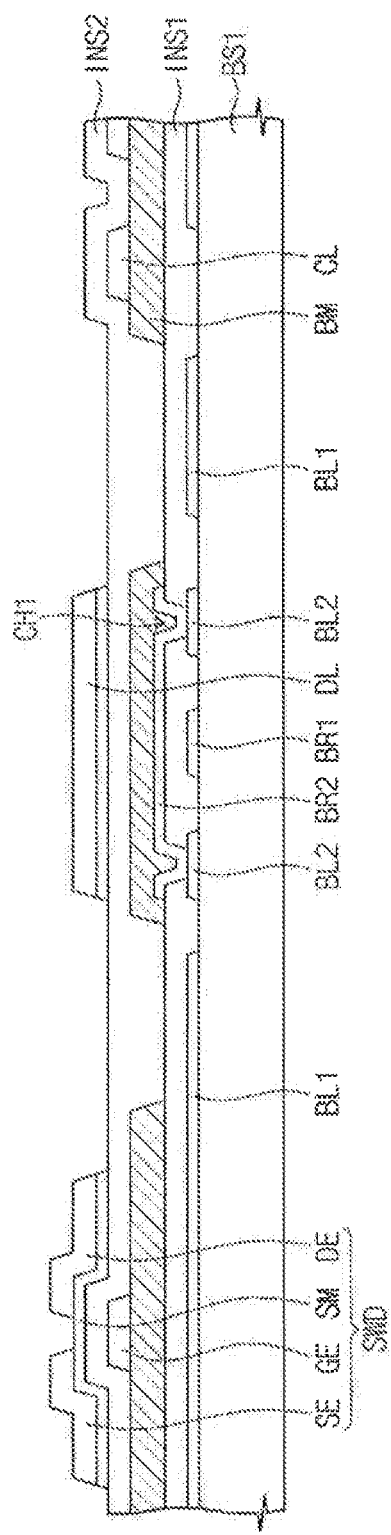

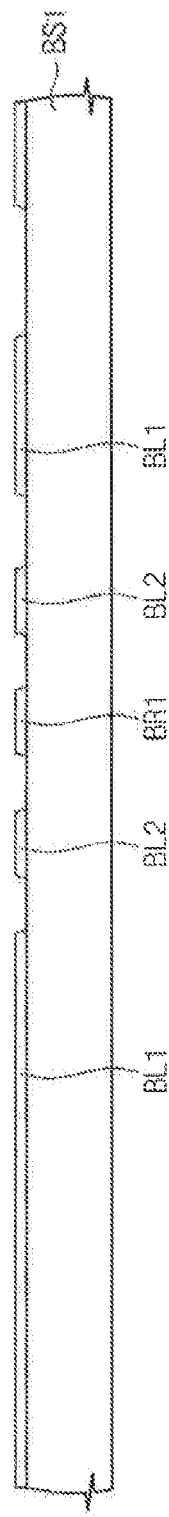

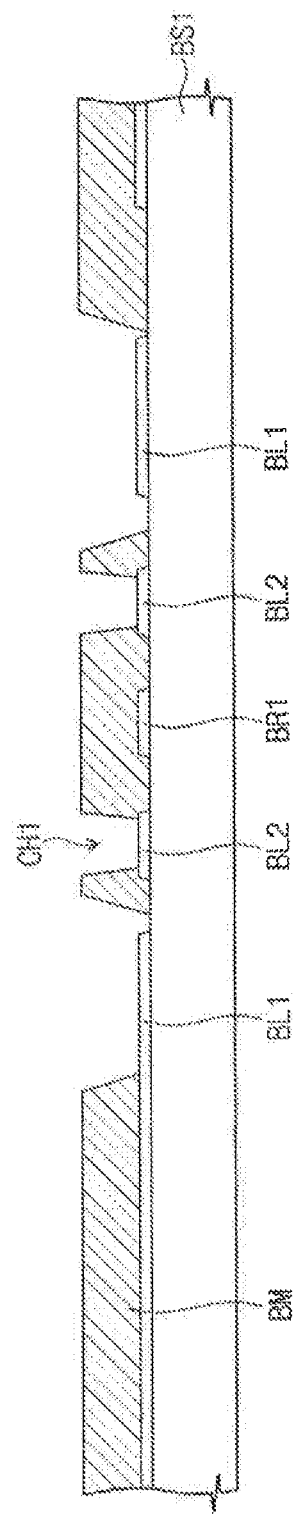

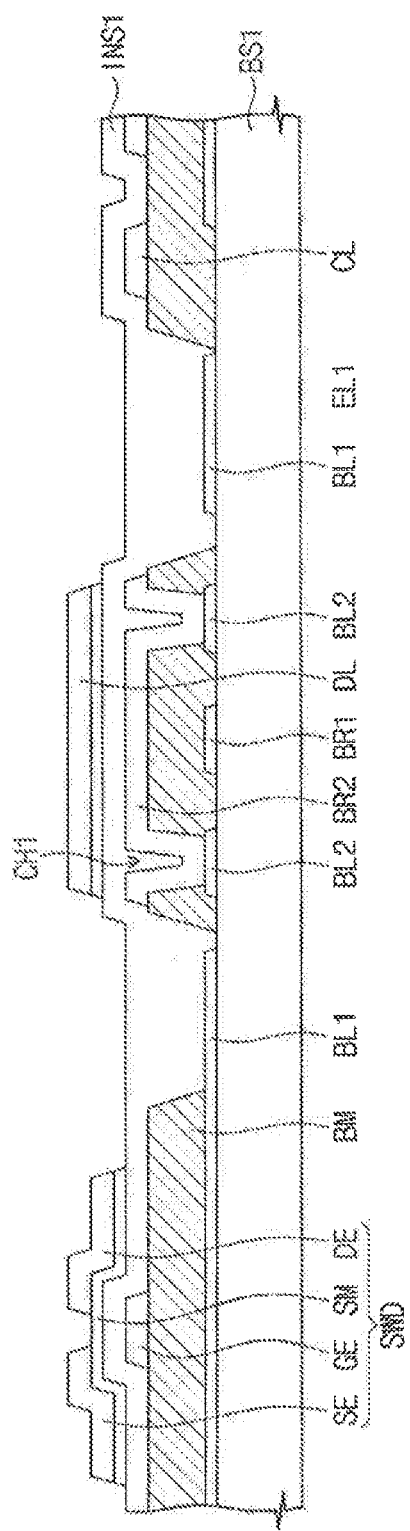

DISPLAY APPARATUS HAVING TOUCH SENSING PART AND METHOD OF MANUFACTURING THE SAME

CROSS-REFERENCE TO RELATED APPLICATION

This application is a divisional of U.S. application Ser. No. 13/771,672 filed on Feb. 20, 2013, which claims priority under 35 U.S.C. §119 of Korean Patent Application No. 10-2012-0038081, filed on Apr. 12, 2012, the disclosures of which are incorporated by reference herein in their entireties.

TECHNICAL FIELD

The present disclosure relates to a display apparatus and a method of manufacturing the same. More particularly, the present disclosure relates to a display apparatus capable of sensing a touch event and a method of manufacturing the display apparatus.

DISCUSSION OF THE RELATED ART

In general, a touch panel is disposed on an image display apparatus to allow a user to select contents on the image display apparatus by contacting the touch panel with a finger or an object. The image display apparatus senses the touched position through the touch panel and receives the content corresponding to the touched position as an input signal.

An increasing number of image display apparatuses adopt the touch panel which results in elimination of the need for a separate external input device, such as a keyboard or a mouse.

When employed in a liquid crystal display, the touch panel is disposed on a liquid crystal display panel, which displays images, to sense position information in response to a user's input. When the touch panel is separately prepared from the liquid crystal display panel, optical properties of the liquid crystal display, such as, e.g., brightness or viewing angle, are degraded, and a thickness of the liquid crystal display increases.

SUMMARY

Embodiments of the present disclosure provide a display apparatus that can increase touch sensitivity and display quality and a method of manufacturing the display apparatus.

An embodiment of the inventive concept provides a display apparatus includes a first base substrate, a touch sensing part provided on the first base substrate, an electronic device provided on the first base substrate, a black matrix provided on the first base substrate, a signal line provided on the black matrix to apply a driving signal to the electronic device, a second base substrate facing the first base substrate, and a liquid crystal layer disposed between the first base substrate and the second base substrate.

The electronic device includes a first electrode, a second electrode that forms an electric field in the liquid crystal layer in cooperation with the first electrode, and a switching device connected to the first electrode.

The touch sensing part includes a plurality of first lines extended in a first direction and applied with an operating voltage and a plurality of second lines extended in a second direction different from the first lines and applied with a sensing voltage. The second lines are capacitively coupled to the first lines and the sensing voltage is changed by the capacitive coupling between the first and second lines. At least one of the first lines includes a plurality of first blocks arranged in the first direction and a plurality of first bridges at least one of which connects adjacent first blocks to each other, at least one of the second lines includes a plurality of second blocks arranged in the second direction and a plurality of second bridges at least one of which connects adjacent second blocks to each other, and the first bridges are insulated from and cross with the second bridges while the black matrix is disposed between the first and second bridges.

The black matrix is disposed between the electronic device and the first blocks, the electronic device and the second blocks, and the electronic device and the first bridges.

The switching device includes a gate electrode disposed on the black matrix, a source electrode disposed so that a portion of the source electrode corresponds to the gate electrode while a first insulating layer is disposed between the source electrode and the gate electrode, a drain electrode spaced apart from the source electrode and disposed so that a portion of the drain electrode corresponds to the gate electrode while the first insulating layer is disposed between the drain electrode and the gate electrode, the drain electrode being connected to the first electrode. The gate electrode and a portion of the second bridges are disposed on the black matrix.

The signal line includes a plurality of gate lines extended in the first direction to apply a gate signal to the gate electrode and a plurality of data lines extended in the second direction to apply a data signal to the source electrode. The black matrix includes contact holes formed therethrough to expose a portion of the second blocks and the second bridges are connected to the second blocks through the contact holes. Thee contact holes are provided in the black matrix corresponding to the gate lines or in the black matrix corresponding to the data lines. The black matrix has a width in an area through which the contact holes are formed. The width of the black matrix is greater than a width in an area through which the contact holes are not formed.

The switching device is provided in a plural number, the switching devices respectively correspond to the gate lines and the data lines, and at least one of the first blocks and the second blocks corresponds to at least one switching device when viewed in a plan view.

According to an embodiment, the signal line includes a plurality of gate lines extended in the first direction to apply a gate signal to the gate electrode and a plurality of data lines extended in the second direction to apply a data signal to the source electrode, and the touch sensing part includes a plurality of touch sensing lines capacitively coupled to the gate lines and extended in the second direction. A voltage applied to the touch sensing part is changed by the capacitive coupling between the touch sensing lines and the gate lines. According to an embodiment, the extension direction of the touch sensing part should not be limited to the second direction. That is, the touch sensing part may be extended in a different direction from the second direction.

According to an embodiment, the first electrode includes a plurality of first branch portions, the second electrode includes a plurality of second branch portions, and the first branch portions are alternately arranged with the second branch portions when viewed in a plan view. In addition, according to embodiments, the first electrode includes a plurality of first branch portions, the second electrode is formed as a single plate, and the first branch portions overlap the second electrode when viewed in a plan view.

An embodiment of the inventive concept provides a display apparatus includes a first base substrate, a touch sensing part provided on the first base substrate, a black matrix provided on the first base substrate, a signal line provided on the black matrix to output a driving signal, a second base substrate facing the first base substrate, a liquid crystal layer disposed between the first base substrate and the second base substrate, and an electronic device that drives the liquid crystal layer in response to the driving signal. The electronic device includes a first electrode, a second electrode that forms an electric field in the liquid crystal layer in cooperation with the first electrode, and a switching device connected to the first electrode. The first electrode is disposed on the first base substrate and the second electrode is disposed on the second base substrate.

At least one of the first electrode and the second electrode includes a domain divider to divide the liquid crystal layer into a plurality of domains.

An embodiment of the inventive concept provides a method of manufacturing a display apparatus includes forming a touch sensing part on a first base substrate, forming a black matrix on the first base substrate, forming a signal line on the black matrix, forming an electronic device connected to the signal line, and forming a liquid crystal layer between the first base substrate and a second substrate.

According to an embodiment, the electronic device is formed by forming a switching device on the first substrate to be connected to the signal line, forming a first electrode on the first substrate to be connected to the switching device, and forming a second electrode on the second base substrate. According to embodiments, the electronic device is formed by forming a switching device on the first substrate to be connected to the signal line, forming a first electrode on the first substrate to be connected to the switching device, and forming a second electrode on the first base substrate to be spaced from and insulated from the first electrode.

The touch sensing part is formed by forming a plurality of first lines extended in a first direction and forming a plurality of second lines extended in a second direction different from the first lines and capacitively coupled to the first lines. At least one of the first lines includes a plurality of first blocks arranged in the first direction and a plurality of first bridges at least one of which connects adjacent first blocks to each other, at least one of the second lines includes a plurality of second blocks arranged in the second direction and a plurality of second bridges insulated from and crossing with the first bridges while the black matrix is disposed between the first and second bridges, and the first blocks, the second blocks, and the first bridges or the second bridges are formed by a single mask process.

According to an embodiment, the signal line is formed by forming a plurality of gate lines extended in the first direction to apply a gate signal to the gate electrode and forming a plurality of data lines extended in the second direction to apply a data signal to the source electrode, and the touch sensing part is formed by forming a plurality of touch sensing lines extended in the first direction and capacitively coupled to the gate lines. A voltage applied to the touch sensing part is changed by the capacitive coupling between the touch sensing lines and the gate lines.

The black matrix includes at least one of molybdenum oxide, manganese oxide, amorphous carbon, silicon-germanium compound, or germanium oxide.

According to the above, the signal line and the electronic device are formed on the substrate on which the touch event occurs by the user, and thus influences may be prevented from entering the liquid crystal layer LC, which are caused by the user's touch, and the display disturbance may be prevented. The display apparatus may prevent the external light from being reflected by the signal line SL and the electronic device ED by using the black matrix BM. Accordingly, the display apparatus may improve the touch sensitivity and the display quality.

According to an embodiment, there is provided a display apparatus including a first base substrate, a second base substrate facing the first base substrate, a liquid crystal layer between the first base substrate and the second base substrate, a touch sensing part and an electronic device on an inner surface of the first base substrate, and a signal line on the touch sensing part or the electronic device.

According to an embodiment, the display apparatus further includes a black matrix on the first base substrate.

BRIEF DESCRIPTION OF THE DRAWINGS

The embodiments of the present invention will become readily apparent by reference to the following detailed description when considered in conjunction with the accompanying drawings wherein:

FIG. 4A is an enlarged plan view of FIG. 3B;

FIGS. 5A, 6A, 7A, 8A, 9A, 10A, and 11A are plan views showing a method of manufacturing a display apparatus according to an exemplary embodiment of the present invention;

FIGS. 5B, 6B, 7B, 8B, 9B, 10B, and 11B are cross-sectional views respectively taken along a line II-II' of FIGS. 5A, 6A, 7A, 8A, 9A, 10A, and 11A;

FIGS. 13B, 14B, 15B, 16B, 17B, and 18B are cross-sectional views respectively taken along a line III-III' of FIGS. 13A, 14A, 15A, 16A, 17A, and 18A;

DETAILED DESCRIPTION

It will be understood that when an element or layer is referred to as being "on", "connected to" or "coupled to" another element or layer, it can be directly on, connected or coupled to the other element or layer or intervening elements or layers may be present. Like reference numbers may refer to like or similar elements throughout the specification and the drawings. As used herein, the term "and/or" includes any and all combinations of one or more of the associated listed items. As used herein, the singular forms, "a", "an" and "the" are intended to include the plural forms as well, unless the context clearly indicates otherwise.

As will be appreciated by one skilled in the art, embodiments of the present invention may be embodied as a system, method, computer program product, or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain, or store a program for use by or in connection with an instruction execution system, apparatus, or device.

Hereinafter, the embodiments of the present invention will be described in detail with reference to the accompanying drawings. The present invention may be embodied in various different ways and should not be construed as limited to the exemplary embodiments described herein.

A display apparatus according to an exemplary embodiment includes a touch panel display apparatus that senses a touch event that occurs when a user contacts the touch panel display apparatus with a finger or an object and displays or transmits information corresponding to the touch event.

Figure 1:
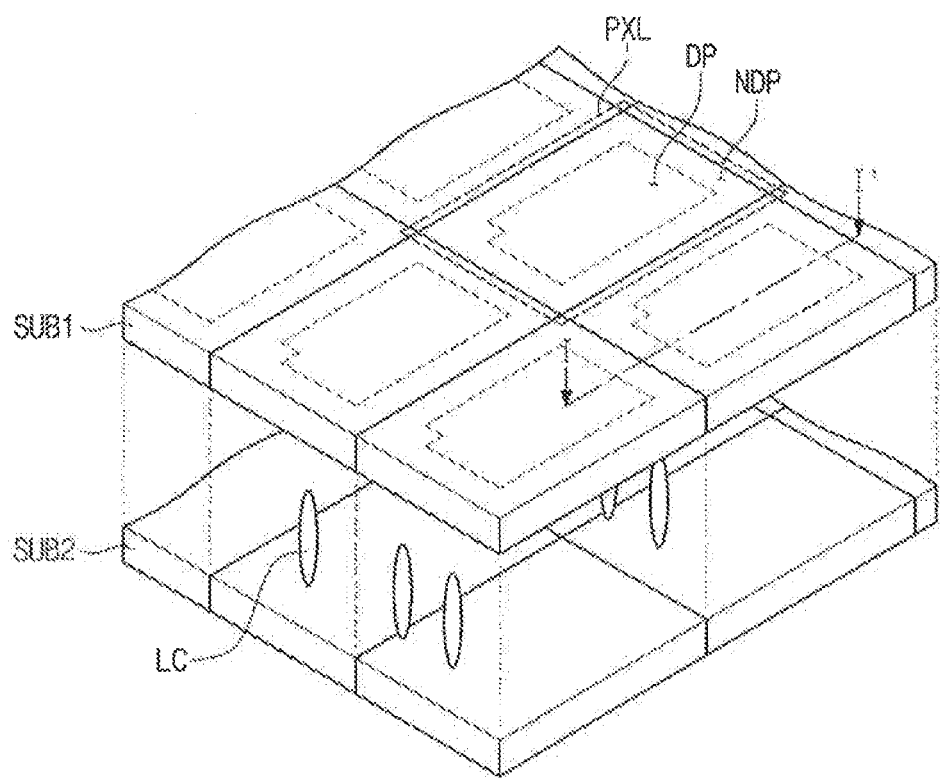
FIG. 1 is a perspective view showing a display apparatus according to an exemplary embodiment of the present invention.
Figure 2:
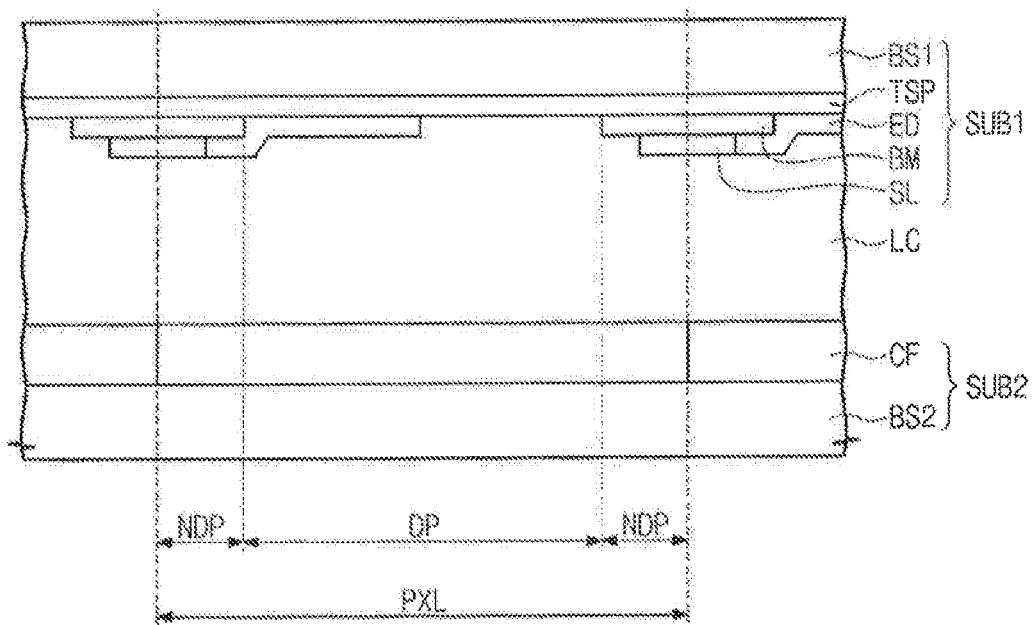
FIG. 2 is a cross-sectional view taken along a line I-I' of FIG. 1.

FIG. 1 is a perspective view showing a display apparatus according to an exemplary embodiment of the present invention, and FIG. 2 is a cross-sectional view taken along a line I-I' of FIG. 1. According to an exemplary embodiment, a touch event occurs on an upper portion of the display apparatus, and an image is displayed in an upper direction of the display apparatus. A light source (not shown) is provided under a lower portion of the display apparatus to provide light to the display apparatus.

Referring to FIGS. 1 and 2, the display apparatus includes a plurality of pixels PXL arranged in a matrix form. Each pixel PXL includes a display area DP in which the image is displayed and a non-display area NDP except for the display area DP when viewed in a plan view. Each pixel PXL includes a first substrate SUB1, a second substrate SUB2 facing the first substrate SUB1, a liquid crystal layer LC disposed between the first substrate SUB1 and the second substrate SUB2, and an electronic device ED that drives the liquid crystal layer LC. The non-display area NDP is disposed adjacent to at least one side of the display area DP, and according to an embodiment, surrounds the display area DP.

The first substrate SUB1 includes an external surface on which the touch event occurs by the user. The first substrate SUB1 includes a first base substrate BS1, a touch sensing part TSP disposed on the first base substrate BS1, a black matrix BM disposed on the first base substrate BS1, and a signal line SL disposed on the black matrix BM to apply a driving signal to the electronic device ED. The touch sensing part TSP, the black matrix BM, and the signal line SL are disposed on a surface opposite to the external surface, e.g., between the first base substrate BS1 and the liquid crystal layer LC.

The first base substrate BS1 includes, but is not limited to, a silicon substrate, a glass substrate, or a plastic substrate. The first base substrate BS1 is formed of a transparent material. According to an exemplary embodiment, the first base substrate BS1 includes a portion of each pixel PXL.

The touch sensing part TSP senses the touch event occurring on the display apparatus by a user's finger or an object. According to an embodiment, the touch sensing part TSP includes a capacitive type touch sensor, a resistive type touch sensor, or an infrared sensitive type touch sensor.

The black matrix BM is disposed in the non-display area NDP of each pixel PXL to block light traveling through an area except the display area DP.

The signal line SL is disposed on the black matrix BM in the non-display area NDP and connected to the electronic device ED and applies the driving signal to the electronic device ED. The signal line SL includes a conductive material, e.g., a metal material. According to an embodiment, the signal line SL is formed of a single metal material, but it should not be limited thereto or thereby. Alternatively, the signal line SL is formed of two or more metal materials or an alloy thereof. According to an embodiment, the signal line SL has a single-layered structure or a multi-layered structure.

The second substrate SUB2 includes a second base substrate BS2 and color filters CF disposed on the second base substrate BS2. According to an embodiment, the color filters CF are omitted or disposed on the first substrate SUB1 rather than the second substrate SUB2. According to an exemplary embodiment, the second base substrate BS2 includes a portion of each pixel PXL.

The electronic device ED is connected to the signal line SL and drives the liquid crystal layer LC in response to the driving signal provided through the signal line SL. The electronic device ED includes electrodes to apply an electric field to the liquid crystal layer LC and a switching device to apply voltages to the electrodes. The electrodes are disposed on the first substrate SUB1 and/or the second substrate SUB2 in accordance with the electric field applied to the liquid crystal layer LC.

The liquid crystal layer LC is driven by the electric field and transmits or blocks the light, thereby displaying an image.

A conventional display apparatus includes a first substrate on which a signal line and an electronic device are formed, a second substrate, and a liquid crystal layer, and a touch 1F event occurs on an external surface of the second substrate. When no electrical shielding member is provided between the liquid crystal layer and the portion at which the touch event occurs, an electric field applied to the liquid crystal layer is fluctuated by the user's touch, and thus display disturbance arises. To prevent this, the conventional display apparatus further includes a separate electrical shielding member (e.g., a transparent conductive layer) disposed on the external surface of the second substrate. However, the transparent conductive layer disposed on the external surface of the second substrate blocks the electric field used to sense the touch event, and thus the touch sensitivity of the conventional display apparatus is degraded.

According to an exemplary embodiment, the signal line SL and the electronic device ED are disposed on the first substrate SUB1, so that the liquid crystal layer LC may be prevented from being influenced or disturbed by the user's touch. The black matrix BM in the display apparatus may prevent external light from being reflected by the signal line SL and the electronic device ED. Accordingly, the display apparatus according to an exemplary embodiment may improve touch sensitivity and display quality.

Figure 3A:
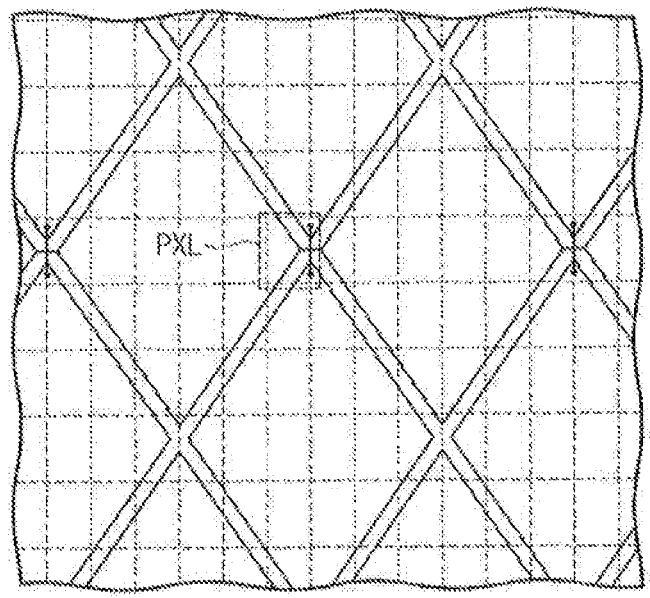
FIG. 3A is a plan view showing a portion of a display apparatus according to an exemplary embodiment of the present invention.
Figure 3B:
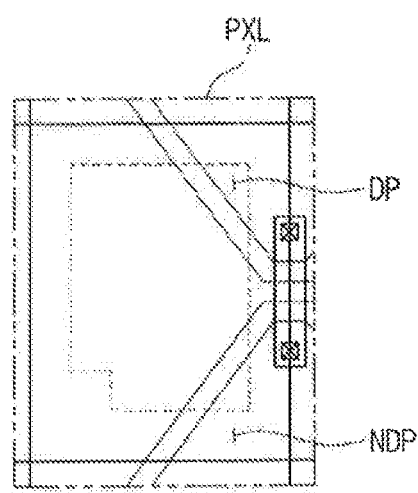
FIG. 3B is an enlarged plan view showing a pixel part of FIG. 3A.
Figure 4B:
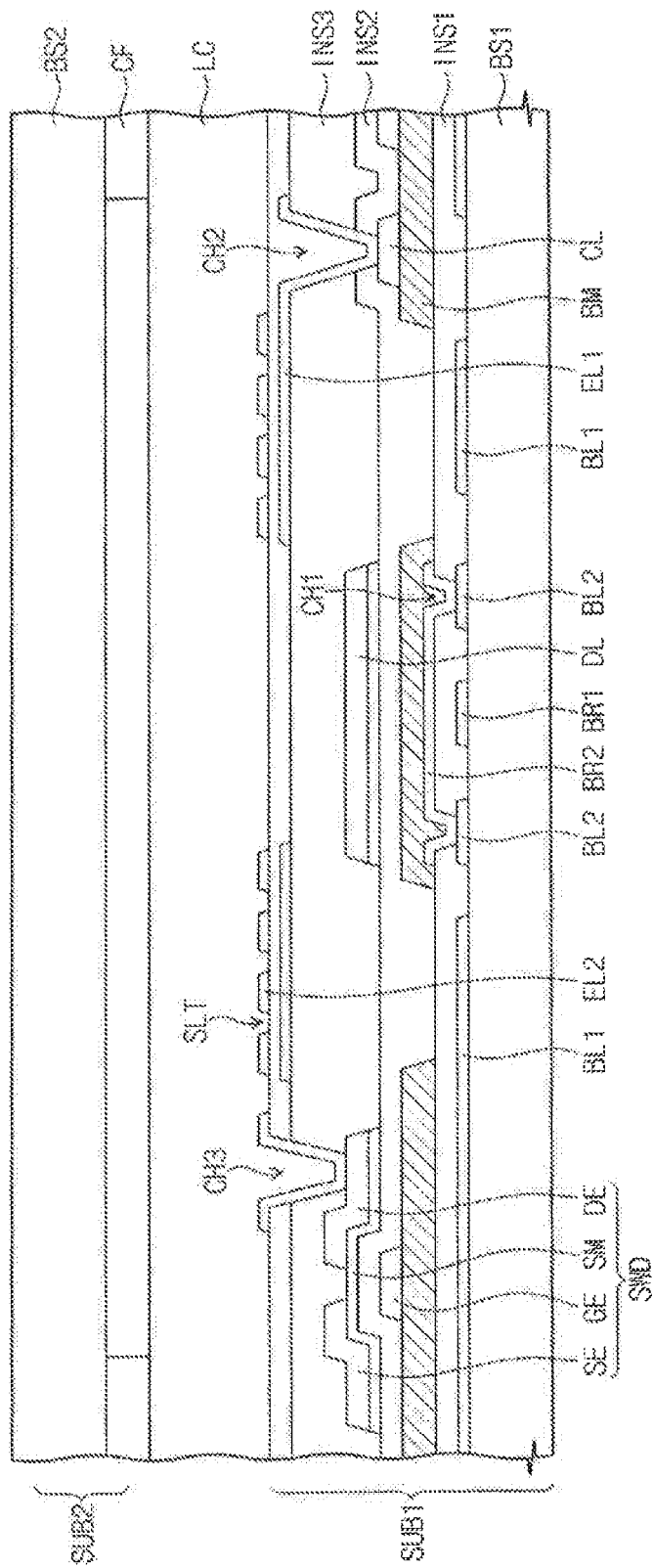
FIG. 4B is a cross-sectional view taken along a line II-II' of FIG. 4A.

FIG. 3A is a plan view showing a portion of a display apparatus according to an exemplary embodiment of the present invention, FIG. 3B is an enlarged plan view showing a pixel part of FIG. 3A, FIG. 4A is an enlarged plan view of FIG. 3B, and FIG. 4B is a cross-sectional view taken along a line II-II' of FIG. 4A. In an exemplary embodiment, for convenience of description, a side of the display apparatus, where a touch event occurs and an image is displayed, is referred to as being in a lower direction of the display apparatus. A plurality of pixels are shown with the touch sensing part disposed in the pixels. According to an embodiment, a light source (not shown) is provided on an upper side of the display apparatus and provides light to the display apparatus.

Referring to FIGS. 3A, 3B, 4A, and 4B, the display apparatus according to an exemplary embodiment includes a plurality of pixels PXL arranged in a matrix form. Each pixel PXL includes a display area DP in which an image is displayed and a non-display area NDP except for the display area DP when viewed in a plan view. Each pixel PXL includes a first substrate SUB1, a second substrate SUB2 facing the first substrate SUB1, a liquid crystal layer LC disposed between the first substrate SUB1 and the second substrate SUB2, and an electronic device that drives the liquid crystal layer LC. The non-display area NDP is disposed adjacent to at least one side of the display area DP, and according to an embodiment, surrounds the display area DP as shown in FIGS. 3A and 3B.

The first substrate SUB1 includes a first base substrate BS1, a touch sensing part disposed on the first base substrate BS1, a black matrix BM disposed on the first base substrate BS, and a signal line disposed on the black matrix BM to apply a driving signal to the electronic device.

The first base substrate BS1 includes, but is not limited to, a silicon substrate, a glass substrate, or a plastic substrate. According to an embodiment, the first base substrate BS1 includes a transparent material. In an exemplary embodiment, the first base substrate BS1 includes a portion of each pixel PXL.

The touch sensing part TSP senses the touch event occurring on the display apparatus by a user's finger or an object. In an exemplary embodiment, the touch sensing part operates in a capacitive mode. The touch sensing part includes a plurality of first lines LN1 extended in a first direction and applied with an operating voltage and a plurality of second lines LN2 extended in a second direction different from the first direction and applied with a sensing voltage. The first lines LN1 are capacitively coupled with the second lines LN2, and the sensing voltage of the second lines LN2 is changed by the capacitive coupling between the first and second lines LN1 and LN2. In an embodiment, the operating voltage is applied to the second lines LN2, and the sensing voltage is applied to the first lines LN1.

Each of the first lines LN1 includes a plurality of first blocks BL1 arranged in the first direction and a plurality of first bridges BR1 each of which connects adjacent first blocks BL1 to each other. The first blocks BL1 have various shapes, such as a bar shape, or a lozenge shape. Each of the second lines LN2 includes a plurality of second blocks BL2 arranged in the second direction and a plurality of second bridges BR2 each of which connects adjacent second blocks BL2 to each other. The second blocks BL2 have various shapes, such as a bar shape, or a lozenge shape. The first blocks BL1 are alternately arranged with the second blocks BL2 in a matrix form on the first base substrate BS1.

The first blocks BL1 and the first bridges BR1 that form each first line LN1 are integrally formed with each other. The second blocks BL2 and the second bridges BR2 that form each second line LN2 are integrally formed with each other. In an exemplary embodiment, each first line LN1 is integrally formed as one piece. According to an embodiment, the second bridges BR2 of each second line LN2 are formed on a layer different from a layer on which the second blocks BL2 are formed. The first blocks BL1, the first bridges BR1, and the second blocks BL2 are disposed on the first base substrate BS1, and a first insulating layer INS1 is disposed on the first blocks BL1, the first bridges BR1, and the second blocks BL2. According to an embodiment, the first insulating layer INS1 includes silicon nitride or silicon oxide. The first insulating layer INS1 is provided with a first contact hole CH1 formed therethrough to expose a portion of each of the second blocks BL2, and each second bridge BR2 connects the adjacent second blocks BL2 to each other through the first contact hole CH1.

According to an embodiment, a controller may be provided to apply a sensing input signal to the first lines LN1 and the second lines LN2 or to detect a sensing output signal from the first lines LN1 and the second lines LN2.

The touch sensing part having the above-mentioned structure is charged with electric charges in accordance with the sensing input signal from the controller. When the touch event occurs on the external surface of the first base substrate BS1 by the user, the capacitance of the first lines LN1 and the second lines LN2 is changed, the sensing signal according to the capacitance is output, and the sensing signal is analyzed by the controller, to thereby find the touch position.

The first blocks BL1 and the second blocks and BL2 correspond to the pixels PXL in a one-to-several correspondence. Therefore, components in each pixel PXL may correspond to the first blocks BL1 and/or the second blocks BL2 in a one-to-several correspondence. For instance, a switching device SWD included in each pixel PXL correspond to the first blocks BL1 and/or the second blocks BL2 in a one-to-several correspondence. In FIGS. 3A and 3B, one first block BL1 or one second block BL2 corresponds to plural pixels PXL. However, the correspondence between the first and second blocks BL1 and BL2 and the pixels PXL should not be limited to the above-mentioned structure. For example, according to an embodiment, the first blocks BL1 and the second blocks BL2 correspond to the pixels PXL in a one-to-one correspondence.

The black matrix BM is disposed on the touch sensing part. The black matrix BM is partially opened corresponding to the display area DP and is disposed in the non-display area NDP. The black matrix BM is formed of an insulating material that absorbs light and displays black. According to an embodiment, the black matrix BM includes at least one of molybdenum oxide, manganese oxide, amorphous carbon, silicon-germanium compound, and germanium oxide.

The signal line and the electronic device are disposed on the first base substrate BS1 on which the black matrix BM is formed. The signal line includes a plurality of gate lines GL, a plurality of data lines DL, and a plurality of common lines CL. The electronic device includes a switching device SWD, a first electrode EL1, and a second electrode EL2.

The gate lines GL and the common lines CL are disposed on the black matrix BM corresponding to the non-display area NDP. Each gate line GL and each common line CL are extended in the first direction in which the first lines LN1 of the touch sensing part are extended, and the gate line GL and the common line CL are spaced apart from each other.

A second insulating layer INS2 is disposed on the gate lines GL and the common lines CL. According to an embodiment, the second insulating layer INS2 includes silicon nitride or silicon oxide.

The data lines DL are disposed on the second insulating layer INS2 and correspond to the non-display area NDP. The data lines DL are extended in the second direction in which the second lines LN2 of the touch sensing part are extended. The data lines DL are insulated from the gate lines GL and the common lines CL while the second insulating layer INS2 is disposed between the data lines DL and the gate and common lines GL and CL. The extension directions in which the gate lines GL and the data lines DL are extended are the same as the first and second directions in which the first lines LN1 and the second lines LN2 are extended, but the extension directions should not be limited to the first and second directions. According to an embodiment, the extension directions of the gate lines GL and the data lines DL are different from the first and second directions in which the first lines LN1 and the second lines LN2 of the touch sensing part are extended.

According to an embodiment, the gate lines GL, the data lines DL, and the common lines CL are formed of a conductive material, e.g., a metal material. According to an embodiment, the gate lines GL, the data lines DL, and the common lines CL are formed of a single metal material, but it should not be limited thereto or thereby. Alternatively, the gate lines GL, the data lines DL, and the common lines CL are formed of two or more metal materials or an alloy thereof. According to an embodiment, the gate lines GL, the data lines DL, and the common lines CL have a single-layered structure or a multi-layered structure.

The switching device SWD is connected to a corresponding gate line of the gate lines GL and a corresponding data line of the data lines DL. The switching device SWD includes a gate electrode GE, a semiconductor layer SM, a source electrode SE, and a drain electrode DE.

The gate electrode GE is branched from the corresponding gate line. The semiconductor layer SM is provided on the second insulating layer INS2 in a thin layer shape. The semiconductor layer SM is disposed above the gate electrode GE and overlaps the gate electrode GE when viewed in a plan view. The source electrode SE is branched from the data line DL.

A third insulating layer INS3 is disposed on the second insulating layer INS2 and covers the switching device SWD. According to an embodiment, the third insulating layer INS3 includes silicon nitride or silicon oxide.

The first electrode EL1 is disposed on the third insulating layer INS3. The second insulating layer INS2 and the third insulating layer INS3 are provided with a second contact hole CH2 formed therethrough and exposes a portion of the common line CL. The first electrode EL1 is connected to the common line CL through the second contact hole CH2. The first electrode EL1 is provided as a single plate and disposed in the display area DP and covers the non-display area NDP.

The first electrode EL1 includes a transparent conductive material. Particularly, the first electrode EL1 includes a transparent conductive oxide, such as indium tin oxide (ITO), indium zinc oxide (IZO), or indium tin zinc oxide (ITZO).

A fourth insulating layer INS4 is disposed on the first base substrate BS1 on which the first electrode EL1 is disposed. According to an embodiment, the fourth insulating layer INS4 includes silicon nitride or silicon oxide. The second electrode EL2 is disposed on the fourth insulating layer INS4. The second electrode EL2 is disposed corresponding to the display area DP and covers a portion of the non-display area NDP. The third and fourth insulating layers INS3 and INS4 are provided with a third contact hole CH3 formed therethrough. The third contact hole CH3 exposes a portion of the drain electrode DE. The second electrode EL2 is connected to the drain electrode DE through the third contact hole CH3. The second electrode EL2 overlaps the first electrode EL1. The second electrode EL2 includes a plurality of slits SLT formed by removing part of the second electrode EL2. The slits SLT are inclined with respect to the first direction or the second direction. The second electrode EL2 includes a plurality of areas in which the slits SLT are inclined in different directions from each other. According to an embodiment, the areas are axisymmetrical or substantially axisymmetrical with respect to an imaginary line crossing the pixel or point-symmetrical or substantially point-symmetrical with respect to a position of the pixel. As an example, the slits SLT axisymmetrical or substantially axisymmetrical with respect to the imaginary line crossing the pixel along the first direction are shown in FIG. 4A.

In other words, the second electrode EL2 includes a trunk portion EL2a formed in each pixel PXL and a plurality of branch portions EL2b divided by the slits SLT and protruded from the trunk portion EL2a. The branch portions EL2b are spaced apart from each other at regular intervals. The branch portions EL2b of the second electrode EL2 form a fringe electric field in cooperation with the first electrode EL1. The branch portions EL2b are extended in a predetermined direction and are parallel or substantially parallel to each other. The trunk portion EL2a and the branch portions EL2b have various shapes. For instance, according to an embodiment, the branch portions EL2b are inclined in a direction in which the trunk portion EL2a is extended and in a direction perpendicular to the extension direction of the trunk portion EL2a. According to an embodiment, the trunk portion EL2a is bent several times.

The second electrode EL2 is formed of a transparent conductive material. For example, according to an embodiment, the second electrode EL2 is formed of a transparent conductive oxide, such as indium tin oxide (ITO), indium zinc oxide (IZO), or indium tin zinc oxide (ITZO).

The second electrode EL2 overlaps a portion of the common lines CL, and thus the second electrode EL2 forms a storage capacitor together with the common lines CL while the second to fourth insulating layers INS2 to INS4 are disposed between the second electrode EL2 and the common lines CL.

The second substrate SUB2 includes a second base substrate BS2 and color filters CF disposed on the second base substrate BS2. The color filters CF allow light passing through the liquid crystal layer LC to have colors. The color filters CF include a red color filter, a green color filter, and a blue color filter. The red, green, and blue color filters are arranged to respectively correspond to the pixels. In an exemplary embodiment, the color filters CF are disposed on the second substrate SUB2, but they should not be limited thereto or thereby. Alternatively, the color filters CF are disposed in the first substrate SUB1. For instance, according to an embodiment, one of the insulating layers of the first substrate SUB1 is replaced with the color filters CF, or the color filters CF are additionally disposed between the insulating layers of the first substrate SUB1.

The liquid crystal layer LC including liquid crystal molecules is disposed between the first substrate SUB1 and the second substrate SUB2.

According to an embodiment, the first electrode EL1 includes a plurality of slits SLT formed by removing part of the first electrode EL1, which is similar to the second electrode EL2. In other words, the first electrode EL1 includes a trunk portion formed in each pixel PXL and a plurality of branch portions divided by the slits and protruded from the trunk portion. According to an embodiment, the branch portions of the first electrode EL1 are alternately arranged with the branch portions EL2b of the second electrode EL2 when viewed in a plan view, and the branch portions of the first electrode EL1 and the branch portions EL2b of the second electrode EL2 form a horizontal electric field.

In the display apparatus having the above-mentioned structure, the thin film transistor is turned on in response to a driving signal provided through a corresponding one of the gate lines. When the thin film transistor is turned on, an image signal provided through the data lines is applied to the first electrode through the thin film transistor. Thus, an electric field is generated between the first electrode and the second electrode and the liquid crystal molecules are arranged, thereby resulting in displaying an image.

As a result, the display apparatus according to an exemplary embodiment may prevent the display disturbance from occurring and external light from being reflected by the signal line, to thereby increase display quality.

FIGS. 5A, 6A, 7A, 8A, 9A, 10A, and 11A are plan views showing a method of manufacturing a display apparatus according to an exemplary embodiment of the present invention, and FIGS. 5B, 6B, 7B, 8B, 9B, 10B, and 11B are cross-sectional views respectively taken along a line II-II' of FIGS. 5A, 6A, 7A, 8A, 9A, 10A, and 11A.

Hereinafter, the method of manufacturing the display apparatus will be described in detail with reference to FIGS. 5A, 6A, 7A, 8A, 9A, 10A, and 11A and FIGS. 5B, 6B, 7B, 8B, 9B, 10B, and 11B.

Figure 5A:
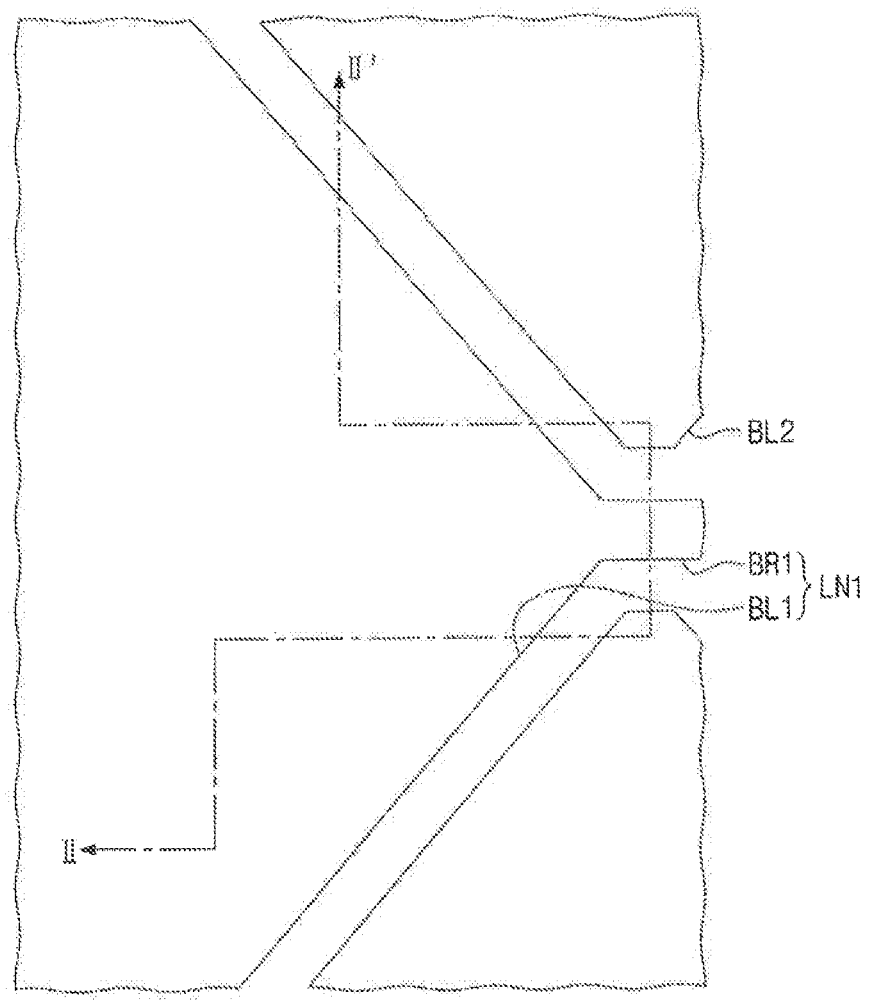
Figure 5B:
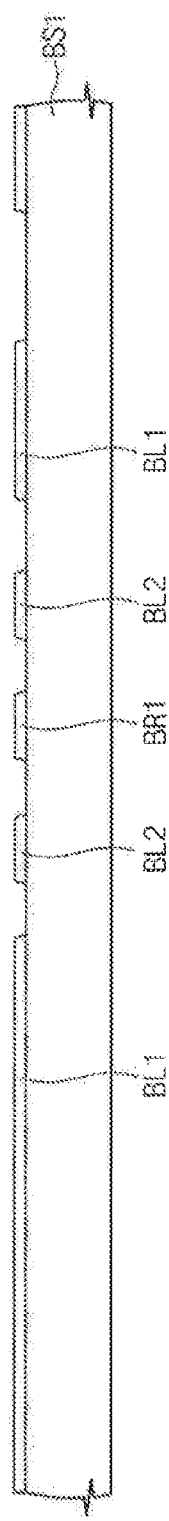

Referring to FIGS. 5A and 5B, a portion of the touch sensing part is formed on the first base substrate BS1. A portion of the touch sensing part formed on the first base substrate BS1 includes the first lines LN1 including the first blocks BL1 and the first bridges BR1 and the second blocks BL2. The first blocks BL1, the first bridges BR1, and the second blocks BL2 are formed by forming a transparent conductive layer on the first base substrate BS1 using a transparent conductive material and by patterning the transparent conductive layer through a photolithography process using a single mask. According to an embodiment, the transparent conductive material includes indium tin oxide (ITO), indium zinc oxide (IZO), or indium tin zinc oxide (ITZO). The first blocks BL1 and the first bridges BR1 of each first line LN1 are integrally formed with each other, and the second blocks BL2 are formed to be spaced apart from the first blocks BL1 and the first bridges BR1.

Figure 6A:
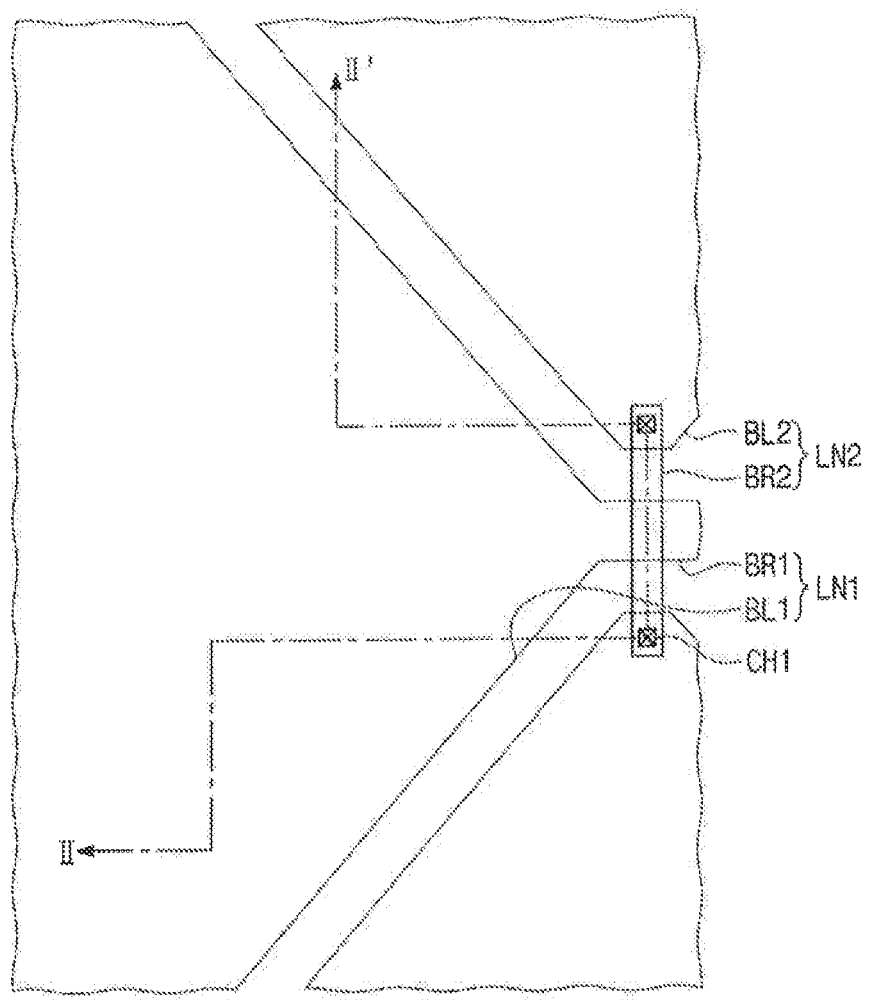
Figure 6B:
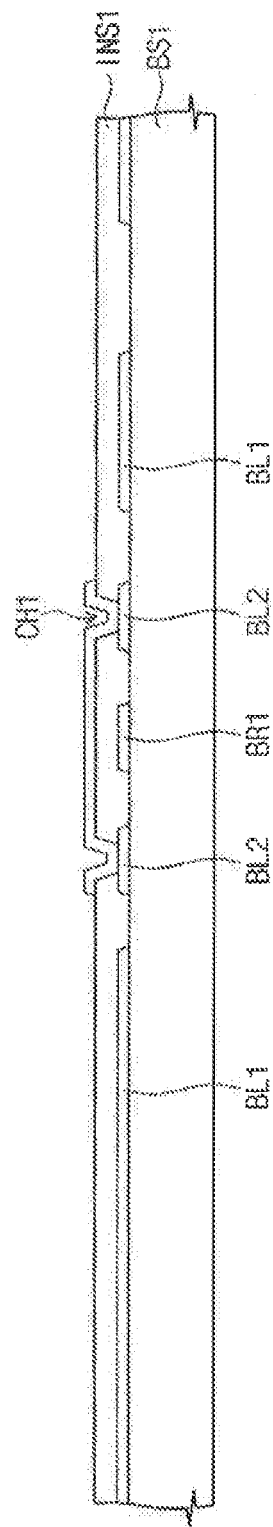

Referring to FIGS. 6A and 6B, the first insulating layer INS1 is formed on the first base substrate BS1 on which the first blocks BL1, the first bridges BR1, and the second blocks BL2 are formed, and the second bridges BR2 are formed on the first insulating layer INS1. The first insulating layer INS1 includes the first contact hole CH1 to expose a portion of the second blocks BL2. The second bridges BR2 are connected to the second blocks BL2 through the first contact hole CH1, and thus second blocks BL2 adjacent to each other are electrically connected to each other. According to an embodiment, the second bridges BR2 include a transparent conductive material or a non-transparent conductive material. According to an embodiment, the transparent conductive material includes ITO, IZO, or ITZO, and the non-transparent conductive material includes metal materials, such as nickel, chromium, molybdenum, aluminum, titanium, copper, or tungsten. When the second bridges BR2 are formed of the transparent conductive material, the second bridges BR2 are formed in the display area DP or the non-display area NDP. However, When the second bridges BR2 are formed of the non-transparent conductive material, the second bridges BR2 are formed only in the non-display area NDP, e.g., an area in which the data line DL is formed.

To form the second blocks BL2, the first insulating layer INS1 is formed on the first base substrate BS1 using the insulating material, and then part of the first insulating layer INS1 is etched through a photolithography process to thereby form the first contact hole CH1. Then, the conductive layer is formed on the first insulating layer INS1 using the transparent or non-transparent conductive material, and the conductive layer is patterned by a photolithography process, thereby forming the second blocks BL2.

Referring to FIGS. 7A and 7B, the black matrix BM is formed on the first base substrate BS1 on which the touch sensing part is formed. FIG. 7A shows an example where the black matrix BM is formed in the non-display area NDP but not in the display area DP. The area in which the black matrix BM is formed corresponds to the area in which the signal line and a portion of the electronic device, e.g., the switching device SWD, are formed. According to an embodiment, the black matrix BM is formed of a black insulating material. For instance, according to an embodiment, the black matrix BM is formed by forming the insulating layer using at least one of molybdenum oxide, manganese oxide, amorphous carbon, silicon-germanium compound, and germanium oxide and by patterning the insulating layer through a photolithography process.

Figure 8B:
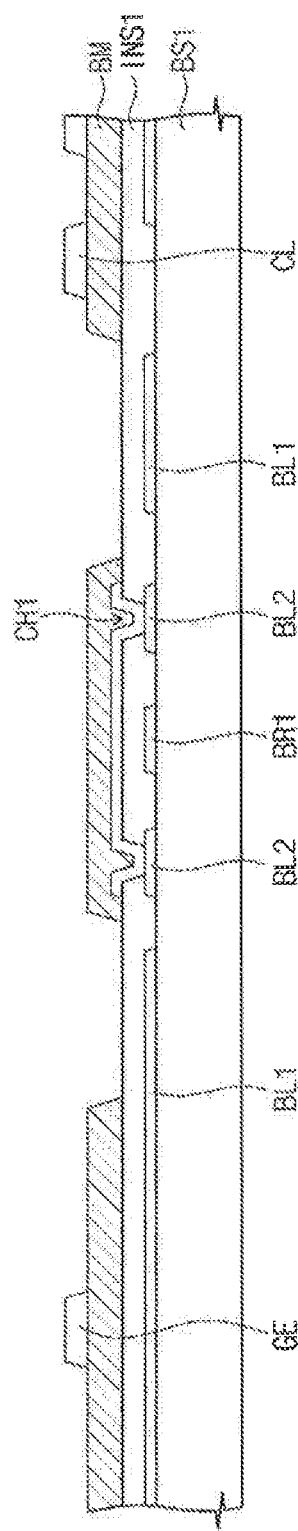

Referring to FIGS. 8A and 8B, a gate line part is formed on the first base substrate BS1 on which the black matrix BM is formed. The gate line part includes the gate line GL, the gate electrode GE, and the common line CL.

The gate line part is formed of a conductive material, e.g., a metal material. According to an embodiment, the gate line part is formed by forming a metal layer over the first base substrate BS1 and by patterning the metal layer using a photolithography process. According to an embodiment, the gate line part is formed of a single metal material or an alloy, but it should not be limited thereto or thereby. Alternatively, the gate line part is formed of two or more metal materials or an alloy thereof. According to an embodiment, the gate line part has a single-layered structure or a multi-layered structure.

Figure 9A:
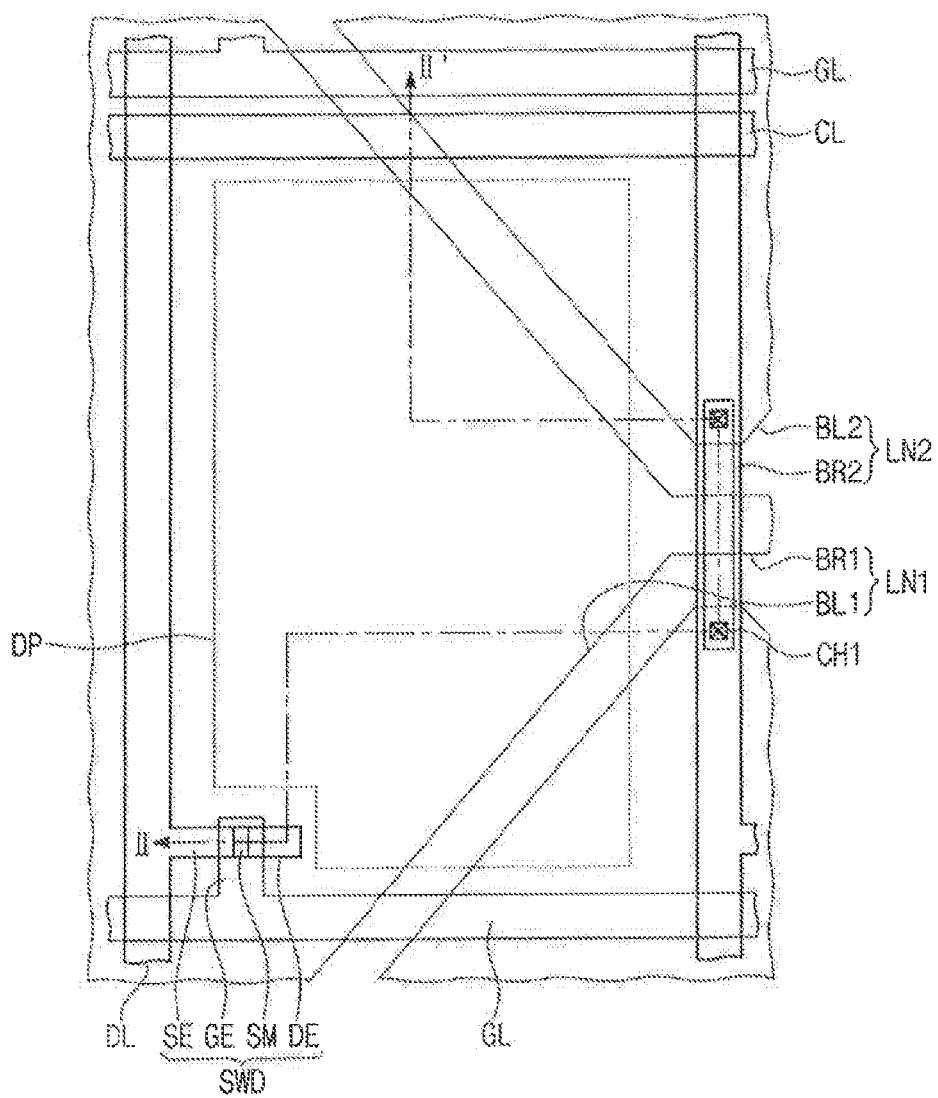

Referring to FIGS. 9A and 9B, the second insulating layer INS2 is formed on the gate line part, and the semiconductor layer SM and a data line part are formed on the second insulating layer INS2. The semiconductor layer SM is disposed above the gate electrode GE and overlaps at least a portion of the gate electrode GE when viewed in a plan view. The data line part is formed on the semiconductor layer SM. The data line part includes the data line DL, the source electrode SE, and the drain electrode DE.

According to an embodiment, the semiconductor layer SM includes silicon semiconductor, including doped or undoped silicon semiconductor or oxide semiconductor. According to an embodiment, the data line part is formed of a conductive material, e.g., a metal material. For instance, according to an embodiment, the data line part is formed by forming a metal layer over the first base substrate BS1 and by patterning the metal layer using a photolithography process. According to an embodiment, the data line part is formed of a single metal material or an alloy, but it should not be limited thereto or thereby. According to an embodiment, the data line part is formed of two or more metal materials or an alloy thereof. According to an embodiment, the data line part has a single-layered structure or a multi-layered structure.

The semiconductor layer SM and the data line part are formed by sequentially forming a semiconductor material and a conductive material (e.g., a metal material) on the second insulating layer INS2 and by patterning the semiconductor material and the conductive material through a photolithography process using a half-tone mask or a diffraction mask. In an exemplary embodiment, the semiconductor layer SM and the data line part are formed by a photolithography process using the half-tone mask or the diffraction mask, but they should not be limited thereto or thereby. According to an embodiment, the semiconductor layer SM and the data line part are formed through a photolithography process using a plurality of masks.

Figure 10A:
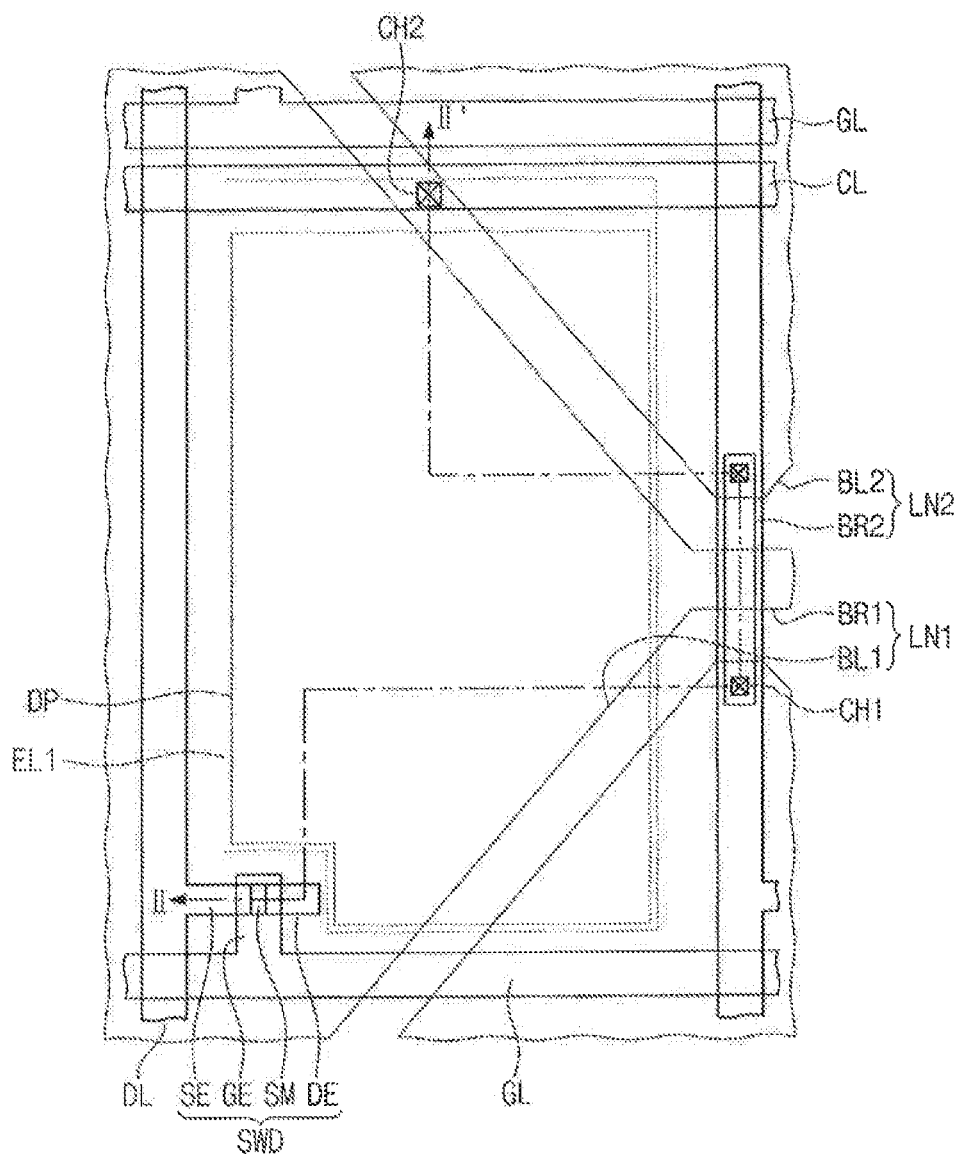
Figure 10B:
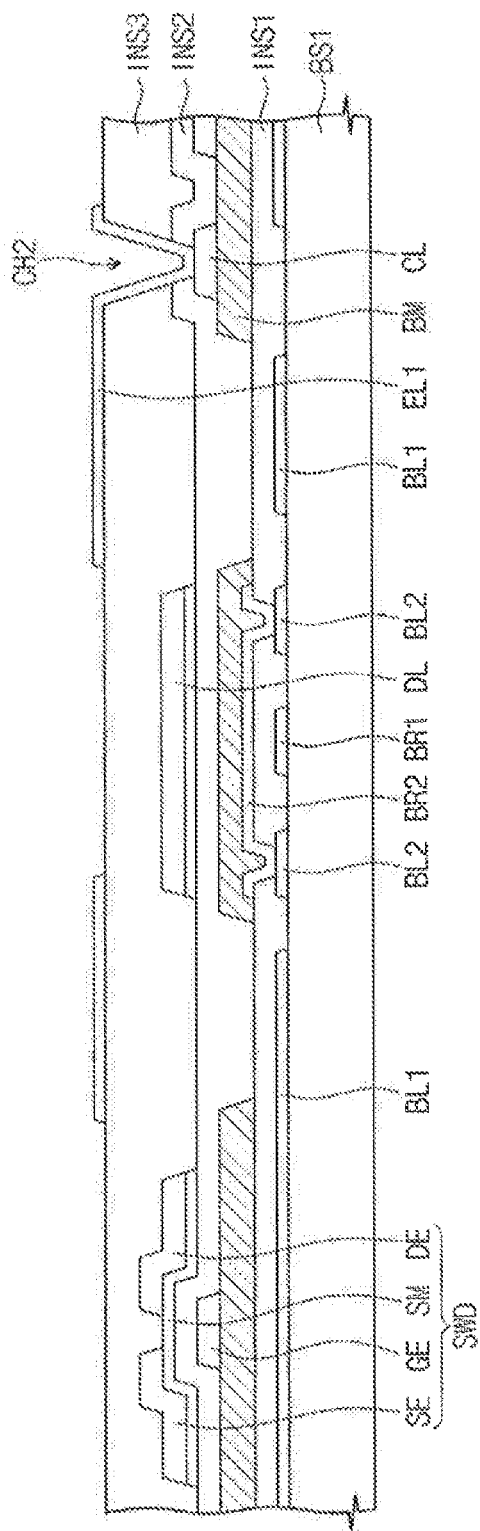

Referring to FIGS. 10A and 10B, the third insulating layer INS3 is formed on the data line part, and the first electrode EL1 is formed on the third insulating layer INS3.

The second insulating layer INS2 and the third insulating layer INS3 are provided with the second contact hole CH2 formed therethrough. The second contact hole CH2 exposes the portion of the common line CL. According to an embodiment, the third insulating layer INS3 is formed by a deposition method using an insulating material, and the second contact hole CH2 is formed by using a photolithography process.

The first electrode EL1 is formed by forming a conductive layer on the third insulating layer INS3 using a conductive material and by patterning the conductive layer using a photolithography process. The first electrode EL1 is connected to the common line CL through the second contact hole CH2.

Figure 11A:
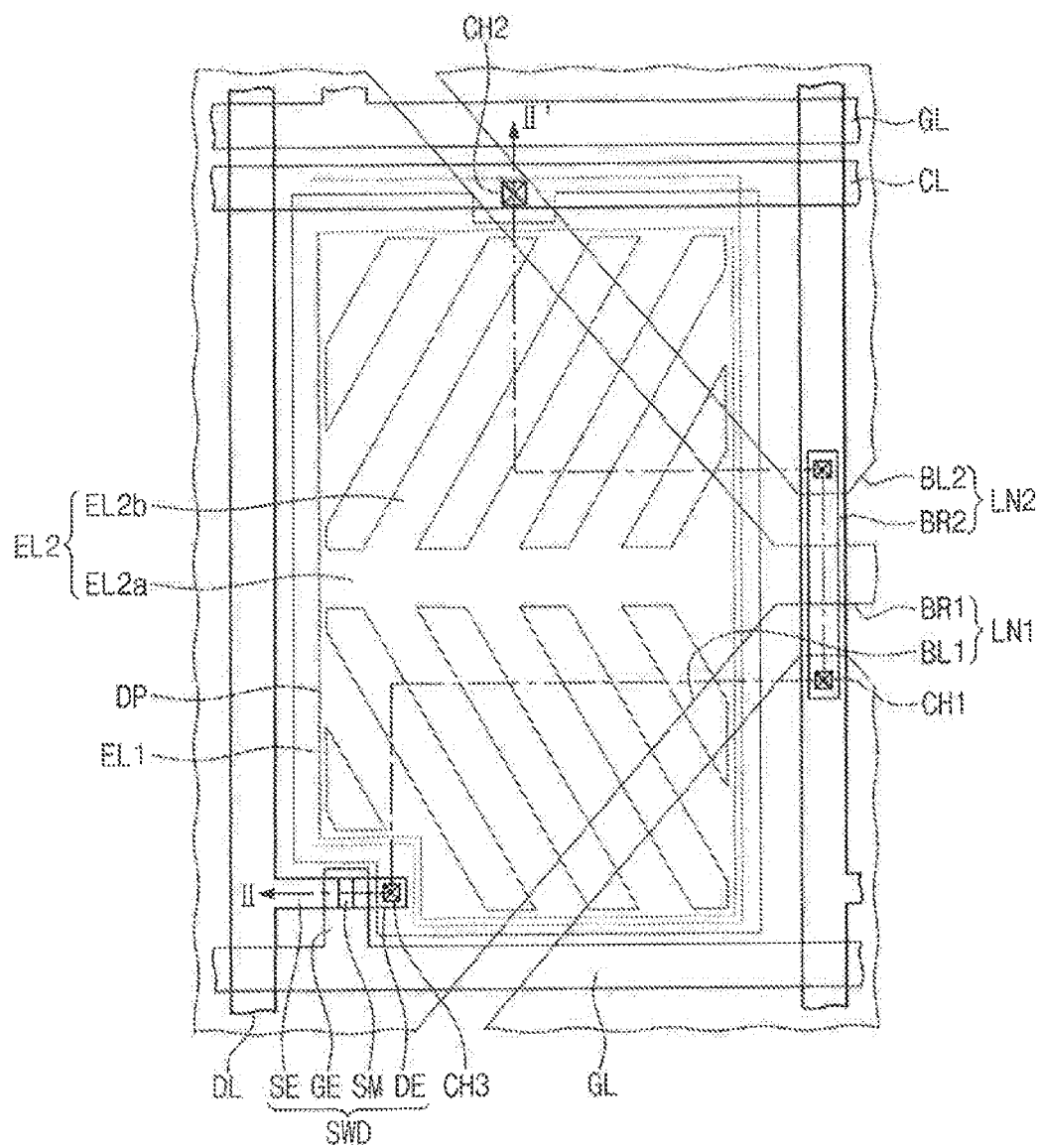
Figure 11B:
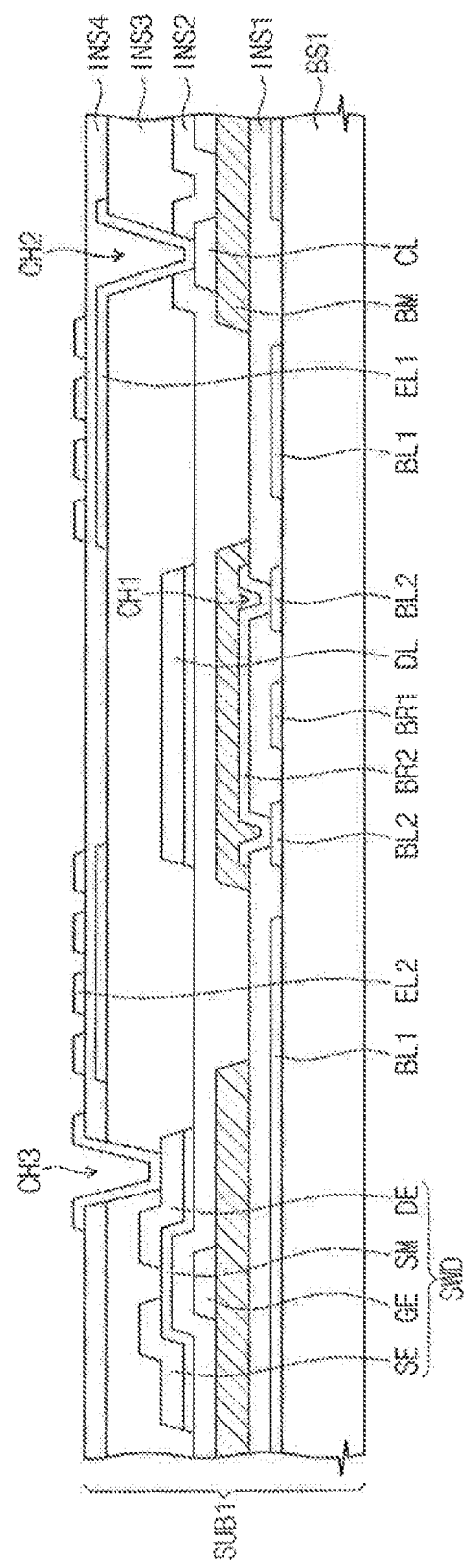

Referring to FIGS. 11A and 11B, the fourth insulating layer INS4 is formed on the first electrode EL1, and the second electrode is formed on the fourth insulating layer INS4.

The fourth insulating layer INS4 is formed by a deposition method using an insulating material. The third insulating layer INS3 and the fourth insulating layer INS4 are provided with a third contact hole CH3 formed therethrough. The third contact hole CH3 exposes the portion of the drain electrode DE. The third contact hole CH3 is formed by using a photolithography process. The second electrode EL2 is formed by forming a conductive layer on the fourth insulating layer INS4 using a conductive material and by patterning the conductive layer through a photolithography process. The second electrode EL2 is connected to the drain electrode DE through the third contact hole CH3.

According to an embodiment, the first electrode EL1 and the second electrode EL2 are formed of a transparent conductive material. The transparent conductive material includes ITO, IZO, or ITZO.

According to an embodiment, the second substrate SUB2 includes the second base substrate BS2 and the color filters CF disposed on the second base substrate BS2. The color filters CF are disposed to respectively correspond to the pixels PXL and formed through a coating process, an inkjet process, or a photolithography process.

According to an embodiment, the first substrate SUB1 is disposed to face the second substrate SUB2, and the liquid crystal layer LC is formed between the first substrate SUB1 and the second substrate SUB2.

Figure 12A:
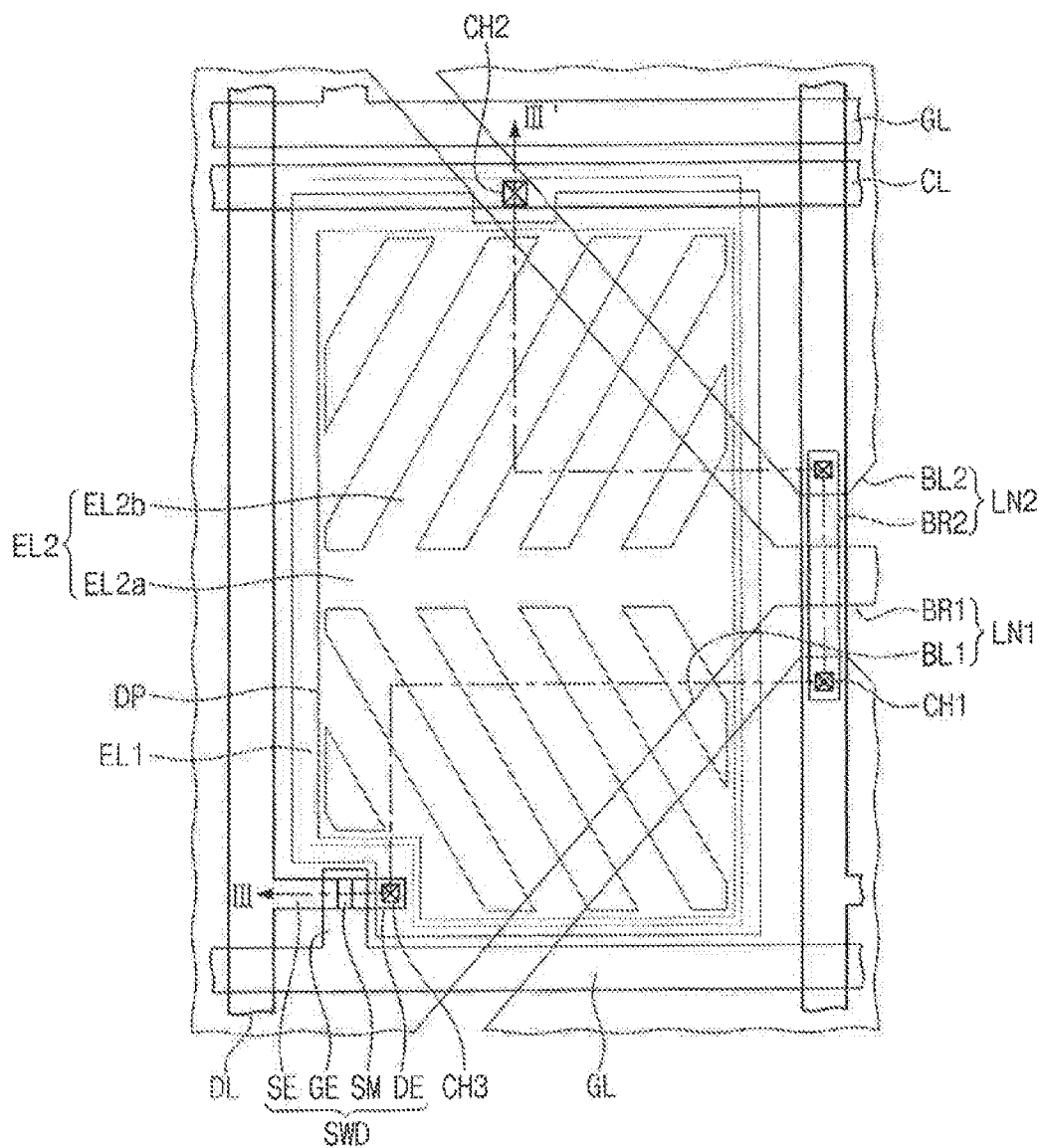
FIG. 12A is a plan view showing a display apparatus according to an exemplary embodiment of the present invention.
Figure 12D:
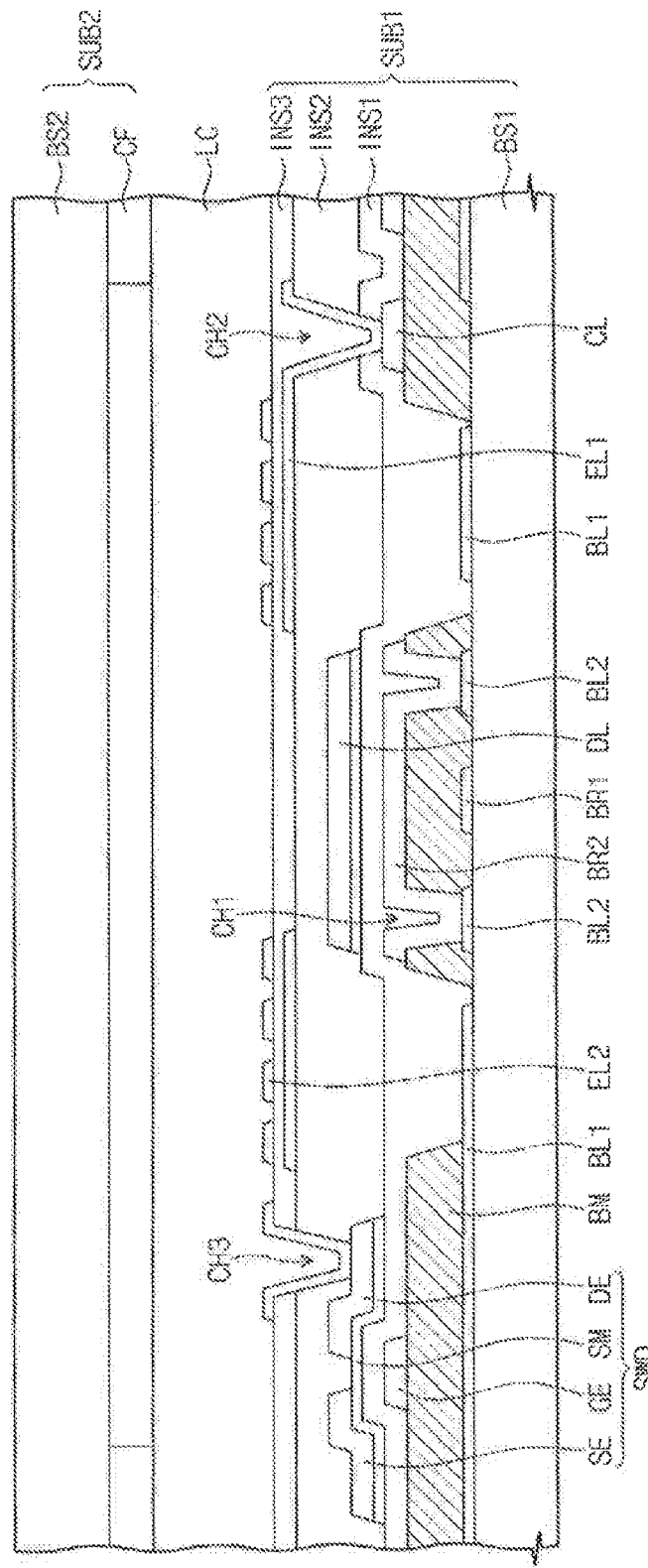
FIG. 12B is a cross-sectional view taken along a line III-III' of FIG. 12A.

FIG. 12A is a plan view showing a display apparatus according to an exemplary embodiment of the present invention, and FIG. 12B is a cross-sectional view taken along a line III-III' of FIG. 12A.

Referring to FIGS. 12A and 12B, each pixel PXL includes a display area DP in which an image is displayed and a non-display area NDP except for the display area DP when viewed in a plan view. Each pixel PXL includes a first substrate SUB1, a second substrate SUB2 facing the first substrate SUB1, a liquid crystal layer LC disposed between the first substrate SUB1 and the second substrate SUB2, and an electronic device that drives the liquid crystal layer LC.

The first substrate SUB1 includes a first base substrate BS1, a touch sensing part disposed on the first base substrate BS1, a black matrix BM disposed on the first base substrate BS1, and a signal line disposed on the black matrix BM to apply a driving signal to the electronic device.

In an exemplary embodiment, the touch sensing part operates in a capacitive mode. The touch sensing part includes a plurality of first lines LN1 extended in a first direction and applied with an operating voltage and a plurality of second lines LN2 extended in a second direction different from the first direction and applied with a sensing voltage. The first lines LN1 are capacitively coupled with the second lines LN2, and the sensing voltage of the second lines LN2 is changed by the capacitive coupling between the first lines LN1 and the second lines LN2. Each of the first lines LN1 includes a plurality of first blocks BL1 arranged in the first direction and a plurality of first bridges BR1 each of which connects adjacent first blocks BL1 to each other. Each of the second lines LN2 includes a plurality of second blocks BL2 arranged in the second direction and a plurality of second bridges BR2 each of which connects adjacent second blocks BL2 to each other. The first blocks BL1 are alternately arranged with the second blocks BL2 in a matrix form on the first base substrate BS1.

The first blocks BL1 and the first bridges BR1 that form each first line LN1 are integrally formed with each other. The second blocks BL2 and the second bridges BR2 that form each second line LN2 are integrally formed with each other. In an exemplary embodiment, each first line LN1 is integrally formed as one piece. According to an embodiment, the second bridges BR2 of each second line LN2 are formed on a layer different from a layer on which the second blocks BL2 are formed. The first blocks BL1, the first bridges BR1, and the second blocks BL2 are disposed on the first base substrate BS1.

Part of the black matrix BM is opened corresponding to the display area DP and is disposed in the non-display area NDP. The black matrix BM includes an area in which the signal line and a switching device SWD of the electronic device are formed. Thus, the black matrix BM covers the area in which the signal line is formed.

The black matrix BM is formed of an insulating material that absorbs light and displays black. According to an embodiment, the black matrix BM includes at least one of molybdenum oxide, manganese oxide, amorphous carbon, silicon-germanium compound, and germanium oxide.

The second bridges BR2, the signal line, and the electronic device are disposed on the first base substrate BS1 on which the black matrix BM is disposed.

The second bridges BR2 are insulated from and cross the first bridges BR1 while the black matrix BM is disposed between the second bridges BR2 and the first bridges BR1.

The signal line is disposed on the black matrix BM of the non-display area NDP. The signal line includes a plurality of gate lines GL, a plurality of data lines DL, and a plurality of common lines CL. The electronic device includes a switching device SWD, a first electrode EL1, and a second electrode EL2.

A first insulating layer INS1 is disposed on the second bridges BR2, the gate lines GL, and the common lines CL. The data lines DL are disposed on the first insulating layer INS1 to correspond to the non-display area NDP and overlaps the second bridges BR2 when viewed in a plan view. In the black matrix BM, the first contact hole CH1 and the second bridges BR2 are positioned on the black matrix BM corresponding to the data lines DL.

According to an exemplary embodiment, the first contact hole CH1 is positioned on the black matrix BM in the area corresponding to the data lines DL. The black matrix BM is not formed in the area (e.g., the opened portion) through which the first contact hole CH1 is formed. The opened portion is surrounded by the black matrix BM. According to an embodiment, the black matrix BM is cut away in the area through which the first contact hole CH1 is formed without being continuously formed when viewed in a plan view. According to an embodiment, a width of the black matrix BM corresponding to the area through which the first contact hole CH1 is formed is larger than a width of the black matrix BM corresponding to an area in which the first contact CH1 is not formed, and thus the black matrix BM may sufficiently cover the first contact hole CH1.

The data lines DL are extended in the second direction in which the second lines LN2 of the touch sensing part are extended. The data lines DL are insulated from the gate lines GL and the common lines CL while the first insulating layer INS1 is disposed between the data lines DL and the gate and common lines GL and CL.

According to an embodiment, the second bridges BR2, the gate lines GL, the data lines DL, and the common lines CL are formed of a conductive material, e.g., a metal material. According to an embodiment, the gate lines GL, the data lines DL, and the common lines CL are formed of a single metal material, but it should not be limited thereto or thereby. According to an embodiment, the gate lines GL, the data lines DL, and the common lines CL are formed of two or more metal materials or an alloy thereof. According to an embodiment, the second bridges BR2, the gate lines GL, the data lines DL, and the common lines CL have a single-layered structure or a multi-layered structure.

The switching device SWD is connected to a corresponding gate line of the gate lines GL and a corresponding data line of the data lines DL. The switching device SWD includes a gate electrode GE, a semiconductor layer SM, a source electrode SE, and a drain electrode DE.

The gate electrode GE is branched from the corresponding gate line. The semiconductor layer SM is provided on the first insulating layer INS1 in a thin layer shape. The semiconductor layer SM is disposed above the gate electrode GE and overlaps the gate electrode GE when viewed in a plan view. The source electrode SE is branched from the data line DL.

A second insulating layer INS2 is disposed on the switching device SWD and covers the switching device SWD.

The first electrode EL1 is disposed on the second insulating layer INS2. The first insulating layer INS1 and the second insulating layer INS2 are provided with a second contact hole CH2 formed therethrough. The second contact hole CH2 exposes a portion of the common line CL. The first electrode EL1 is connected to the common line CL through the second contact hole CH2. According to an embodiment, the first electrode EL1 is provided as a single plate and disposed in the display area DP.

A third insulating layer INS3 is disposed on the first base substrate BS1 on which the first electrode EL1 is disposed. The second electrode EL2 is disposed on the third insulating layer INS3. The second and third insulating layers INS2 and INS3 are provided with a third contact hole CH3 formed therethrough. The third contact hole CH3 exposes a portion of the drain electrode DE. The second electrode EL2 is connected to the drain electrode DE through the third contact hole CH3. The second electrode EL2 includes a plurality of slits SLT formed by removing part of the second electrode EL2. The slits SLT are inclined with respect to the first direction or the second direction. The second electrode EL2 includes a plurality of areas in which the slits SLT are inclined in different directions from each other, and according to an embodiment, the areas are axisymmetrical or substantially axisymmetrical with respect to an imaginary line crossing the pixel or point-symmetrical or substantially point-symmetrical with respect to a position of the pixel.

The second electrode EL2 overlaps a portion of the common lines CL, and thus the second electrode EL2 forms a storage capacitor together with the common line CL while the first to third insulating layers INS1 to INS3 are disposed between the second electrode EL2 and the common line CL.

The second substrate SUB2 includes a second base substrate BS2 and color filters CF disposed on the second base substrate BS2. The color filters CF allow light passing through the liquid crystal layer LC to have colors.

The liquid crystal layer LC including liquid crystal molecules is disposed between the first substrate SUB1 and the second substrate SUB2.

According to an exemplary embodiment, the display apparatus prevents the display disturbance from occurring and external light from being reflected by the signal line, to thereby increase display quality.

FIGS. 13A, 14A, 15A, 16A, 17A, and 18A are plan views showing a method of manufacturing a display apparatus according to an exemplary embodiment of the present invention, and FIGS. 13B, 14B, 15B, 16B, 17B, and 18B are cross-sectional views respectively taken along a line III-III' of FIGS. 13A, 14A, 15A, 16A, 17A, and 18A.

Hereinafter, a method of manufacturing the display apparatus according to an exemplary embodiment will be described in detail with reference to FIGS. 13A, 14A, 15A, 16A, 17A, and 18A and FIGS. 13B, 14B, 15B, 16B, 17B, and 18B.

Figure 13A:
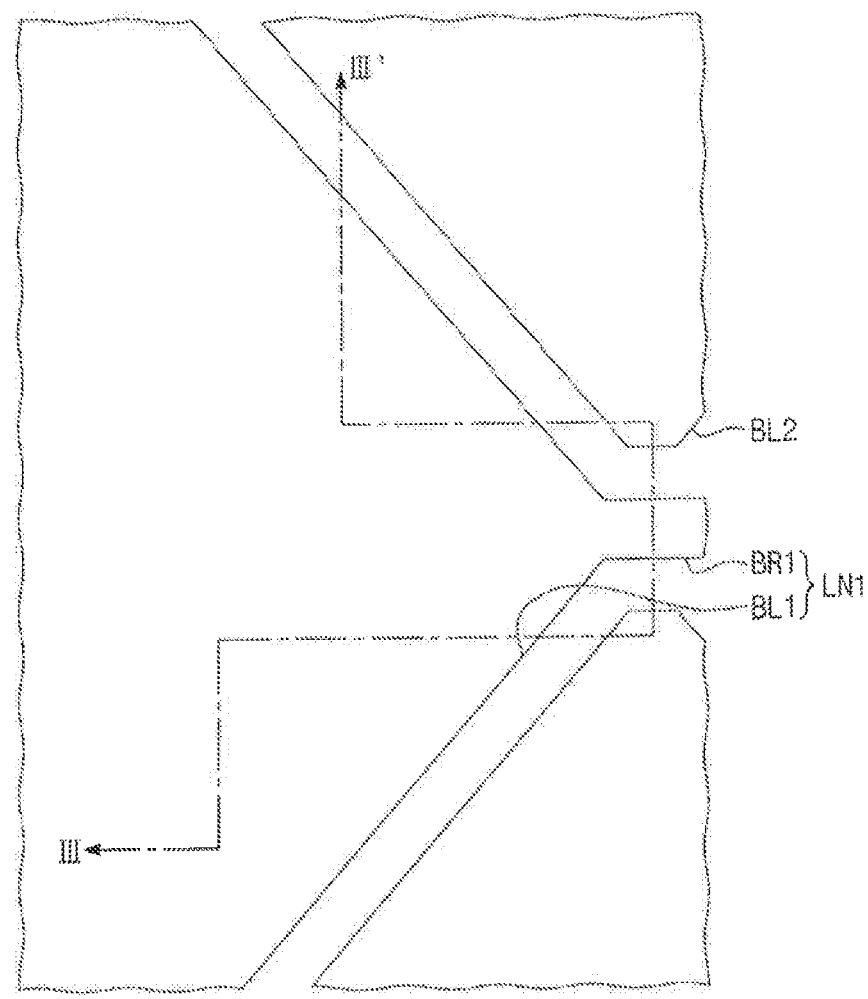
FIGS. 13A, 14A, 15A, 16A, 17A, and 18A are plan views showing a method of manufacturing a display apparatus according to an exemplary embodiment of the present invention.

Referring to FIGS. 13A and 13B, a portion of the touch sensing part is formed on the first base substrate BS1. The portion of the touch sensing part formed on the first base substrate BS1 includes the first lines LN1 including the first blocks BL1 and the first bridges BR1 and the second blocks BL2. The first blocks BL1, the first bridges BR1, and the second blocks BL2 are formed by forming a transparent conductive layer on the first base substrate BS1 using a transparent conductive material and by patterning the transparent conductive layer through a photolithography process using a single mask.

Figure 14A:
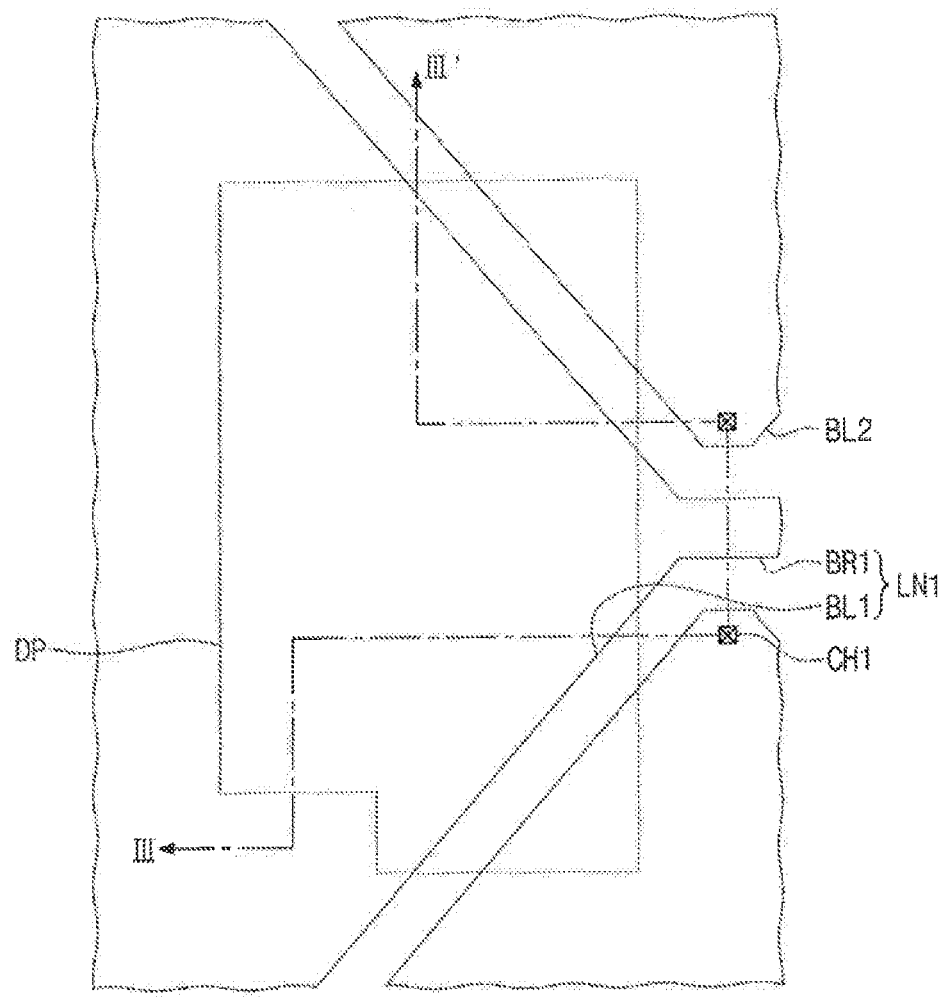

Referring to FIGS. 14A and 14B, the black matrix BM is formed on the first base substrate BS1 on which the portion of the touch sensing part is formed. FIG. 14A shows an example where the black matrix BM is formed in the non-display area NDP but not in the display area DP. The area in which the black matrix BM is formed corresponds to the area in which the signal line and a portion of the electronic device, e.g., the switching device SWD, are formed. The black matrix BM includes the first contact hole CH1 corresponding to the area in which a portion of the signal line is formed. The black matrix BM is formed of a black insulating material. For instance, according to an embodiment, the black matrix BM is formed by forming the insulating layer using at least one of molybdenum oxide, manganese oxide, amorphous carbon, silicon-germanium compound, and germanium oxide and by patterning the insulating layer through a photolithography process.

Figure 15A:
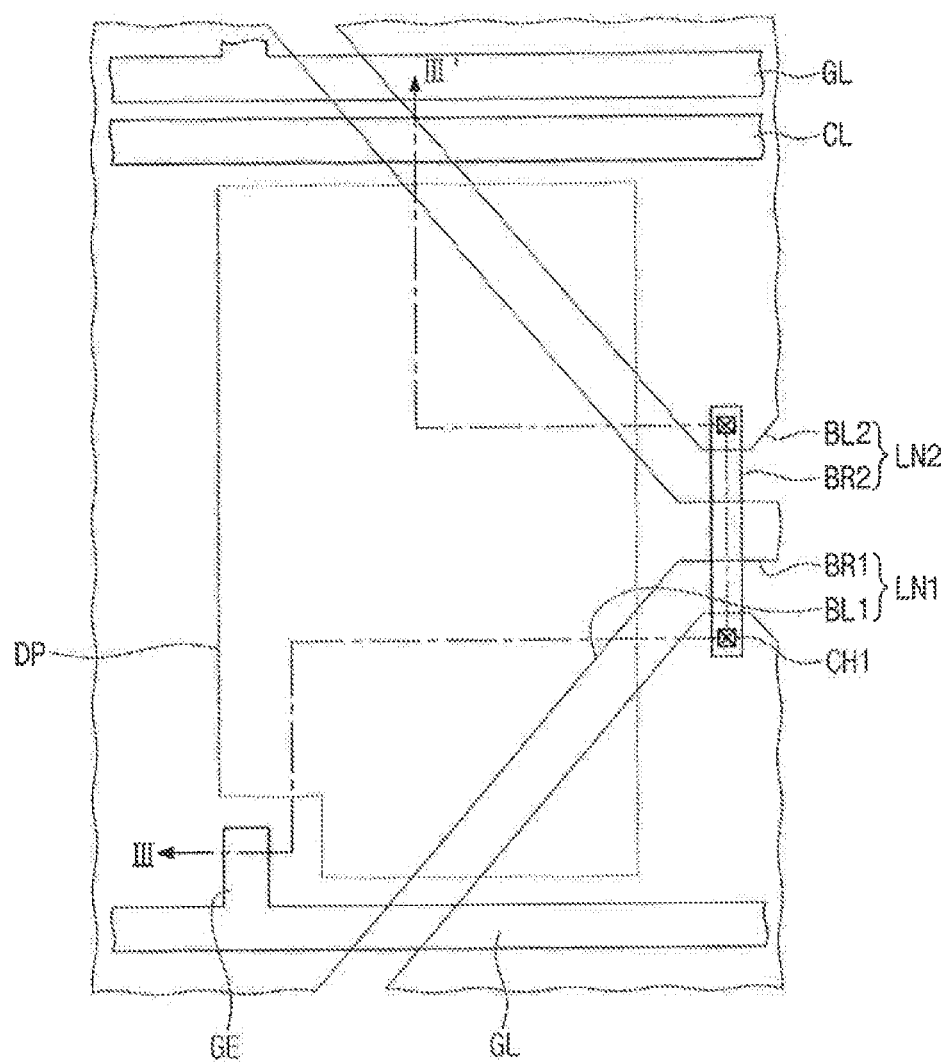
Figure 15B:
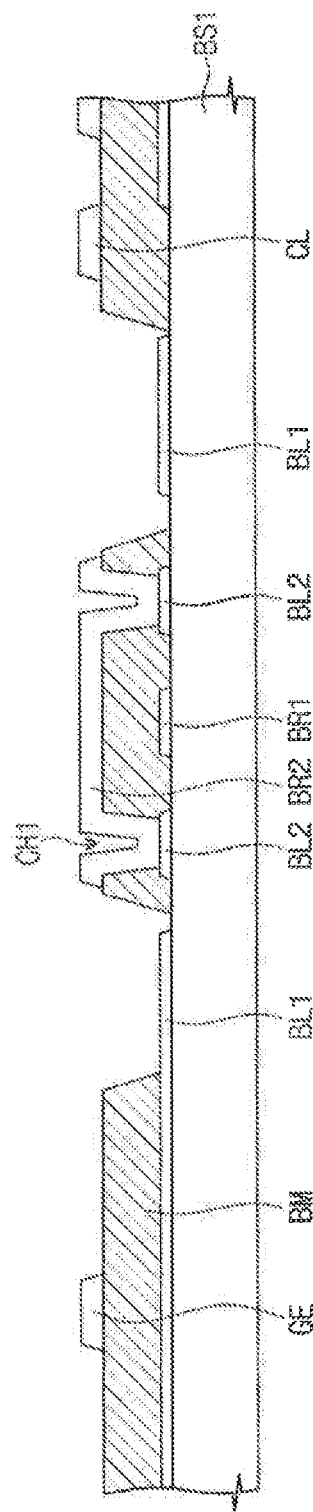

Referring to FIGS. 15A and 15B, the second bridges BR2 and a gate line part are formed on the first base substrate BS1, on which the black matrix BM is formed, through a single process. The gate line part includes the gate line GL, the gate electrode GE, and the common line CL. The second bridges BR2 and the gate line part are formed of a conductive material, e.g., a metal material. According to an embodiment, the second bridges BR2 and the gate line part are formed by forming a metal layer over the first base substrate BS1 and by patterning the metal layer through a photolithography process using one mask. According to an embodiment, the second bridges BR2 and the gate line part are formed of a single metal material or an alloy, but it should not be limited thereto or thereby. According to an embodiment, the gate line part is formed of two or more metal materials or an alloy thereof. According to an embodiment, the gate line part has a single-layered structure or a multi-layered structure.

Figure 16A:
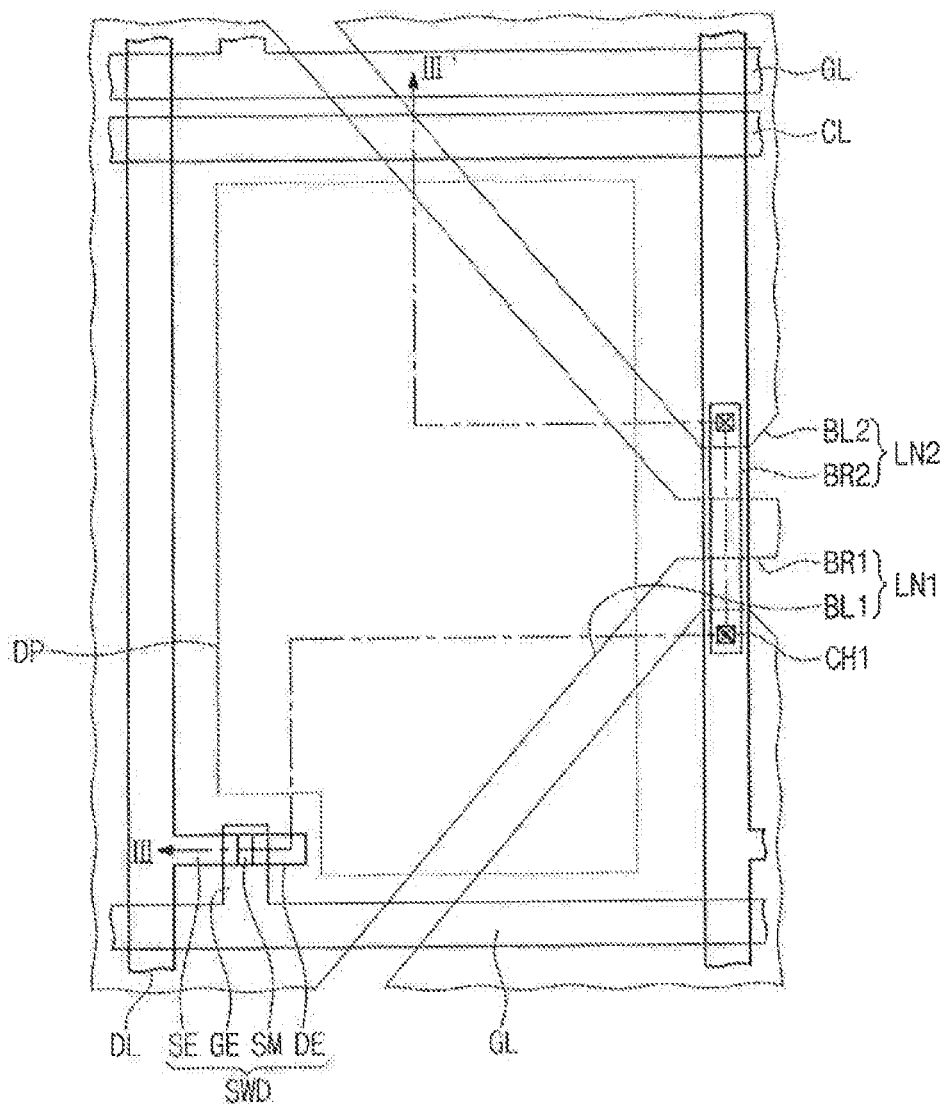

Referring to FIGS. 16A and 16B, the first insulating layer INS1 is formed on the gate line part, and the semiconductor layer SM and a data line part are formed on the first insulating layer INS1. The semiconductor layer SM is disposed above the gate electrode GE and overlaps at least a portion of the gate electrode GE when viewed in a plan view. The data line part is formed on the semiconductor layer SM. The data line part includes the data line DL, the source electrode SE, and the drain electrode DE.

The semiconductor layer SM and the data line part are formed by sequentially forming a semiconductor material and a conductive material (e.g., a metal material) on the first insulating layer INS1 and by patterning the semiconductor material and the conductive material through a photolithography process using a half-tone mask or a diffraction mask. According to an embodiment, the data line part is formed of a single metal material or an alloy, but it should not be limited thereto or thereby. According to an embodiment, the data line part is formed of two or more metal materials or an alloy thereof. According to an embodiment, the data line part has a single-layered structure or a multi-layered structure.

Figure 17A:
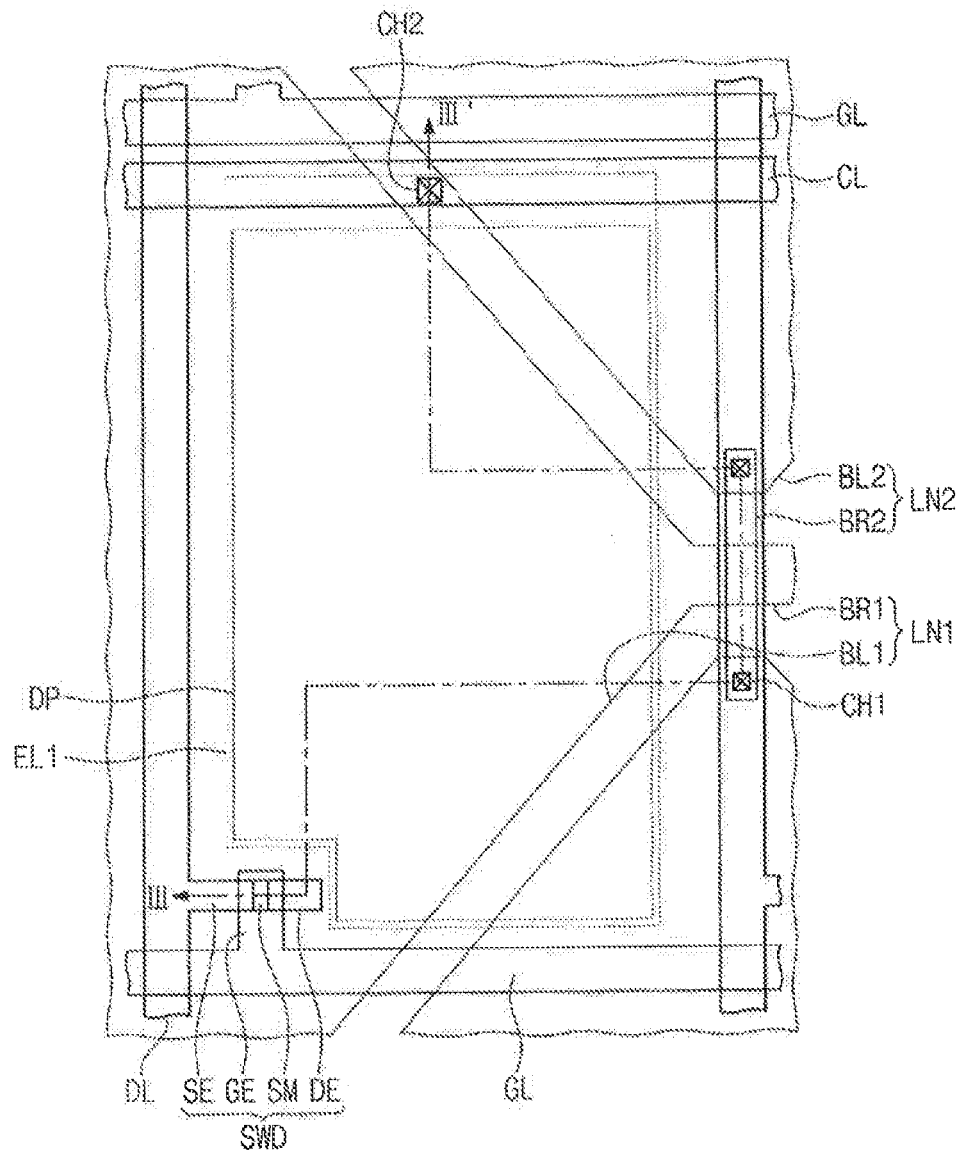
Figure 17B:
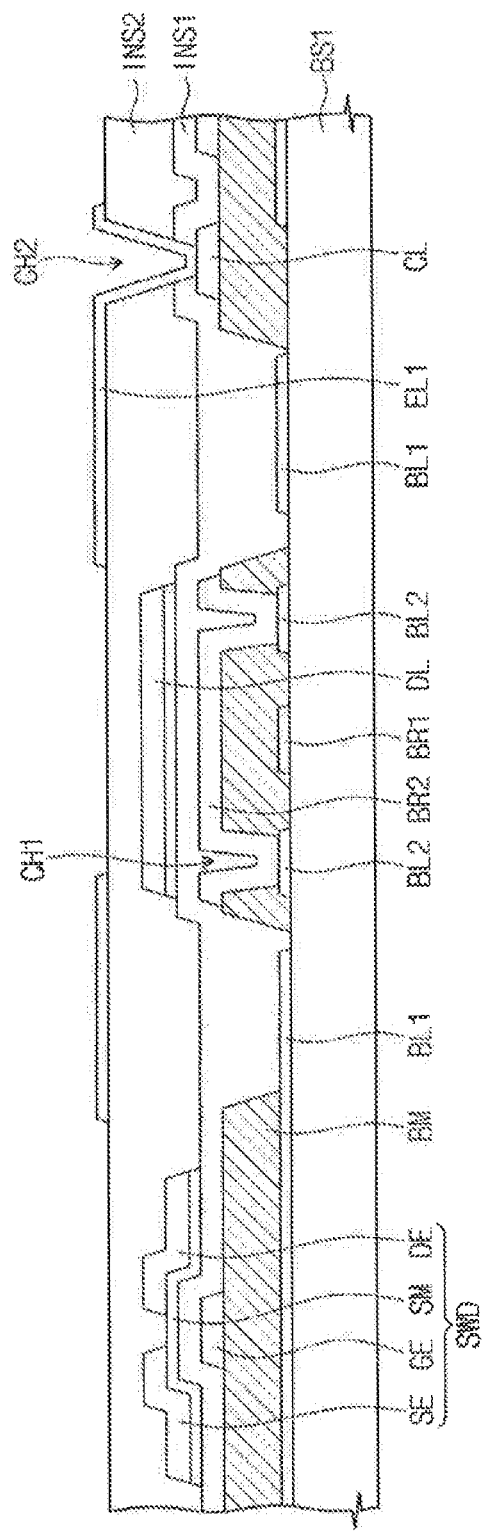

Referring to FIGS. 17A and 17B, the second insulating layer INS2 is formed on the data line part, and the first electrode EL1 is formed on the second insulating layer INS2. The first insulating layer INS1 and the second insulating layer INS2 are provided with the second contact hole CH2 formed therethrough. The second contact hole CH2 exposes the portion of the common line CL.

The second insulating layer INS2 is formed by a deposition method using an insulating material, and the second contact hole CH2 is formed by using a photolithography process. The first electrode EL1 is formed by forming a conductive layer on the second insulating layer INS2 using a conductive material and by patterning the conductive layer using a photolithography process.

The first electrode EL1 is connected to the common line CL through the second contact hole CH2.

Figure 18A:
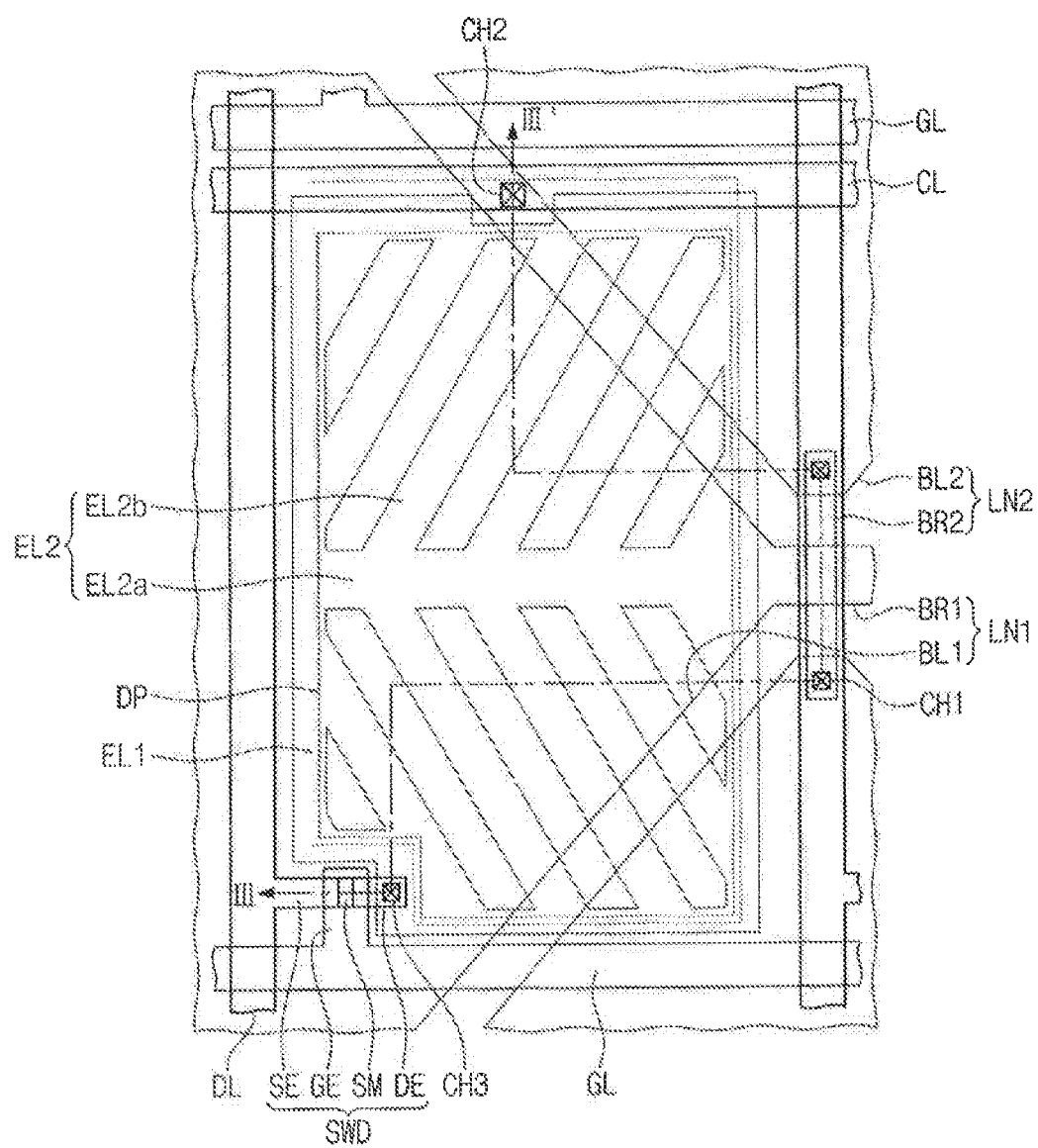
Figure 18B:
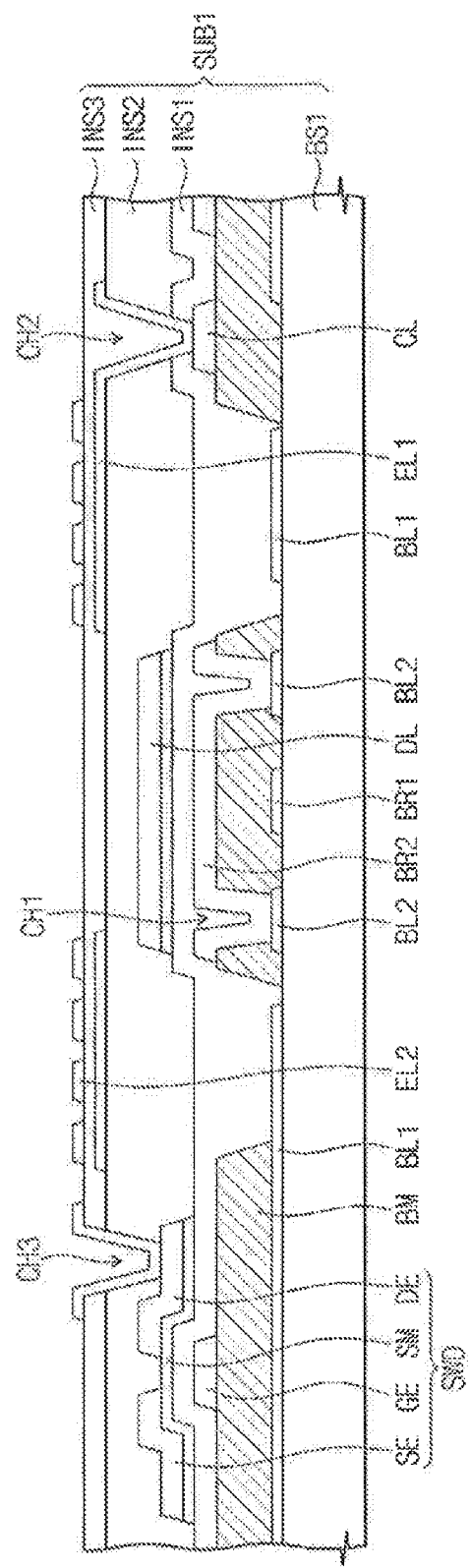

Referring to FIGS. 18A and 18B, the third insulating layer INS3 is formed on the first electrode EL1, and the second electrode EL2 is formed on the third insulating layer INS3.

The third insulating layer INS3 is formed by a deposition method using an insulating material. The second insulating layer INS2 and the third insulating layer INS3 are provided with a third contact hole CH3 formed therethrough. The third contact hole CH3 exposes the portion of the drain electrode DE. The third contact hole CH3 is formed by using a photolithography process. The second electrode EL2 is formed by forming a conductive layer on the third insulating layer INS3 using a conductive material and by patterning the conductive layer through a photolithography process. The second electrode EL2 is connected to the drain electrode DE through the third contact hole CH3.

The first electrode EL1 and the second electrode EL2 are formed of a transparent conductive material. The transparent conductive material includes ITO, IZO, or ITZO.

According to an embodiment, the second substrate SUB2 includes the second base substrate BS2 and the color filters CF disposed on the second base substrate BS2. The color filters CF are disposed to respectively correspond to the pixels PXL and formed through a coating process, an inkjet process, or a photolithography process.

According to an embodiment, the first substrate SUB1 is disposed to face the second substrate SUB2, and the liquid crystal layer LC is formed between the first substrate SUB1 and the second substrate SUB2.

According to an exemplary embodiment, since the second bridges and the data line part are formed once through the single mask process when the touch sensing part and the signal line are formed, manufacturing time and cost of the display apparatus may be reduced. When the touch sensing part is formed, the first bridges or the second bridges are not formed by using a separate mask. The first bridges or the second bridges are not formed in a separate layer. Therefore, a thickness of the display apparatus may be reduced.

Figure 19A:
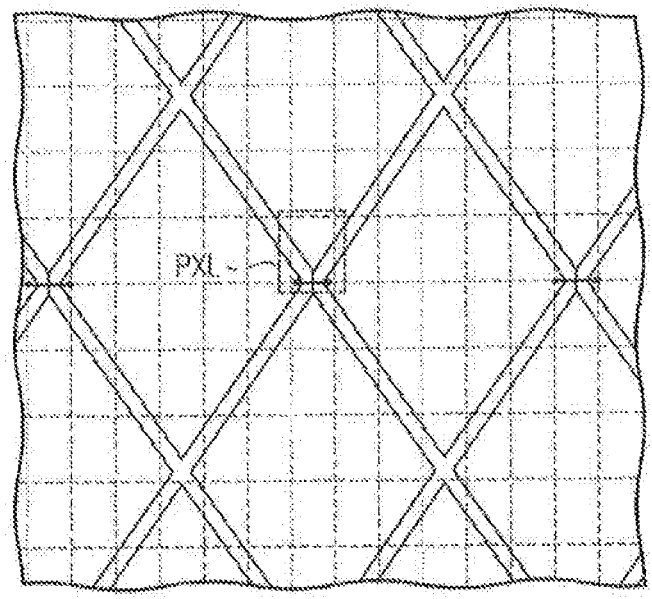
FIG. 19A is a plan view showing a portion of a display apparatus according to an exemplary embodiment of the present invention.
Figure 19B:
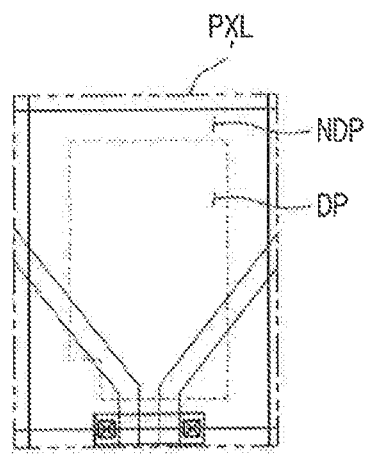
FIG. 19B is an enlarged plan view showing a pixel part of FIG. 19A.
Figure 20A:
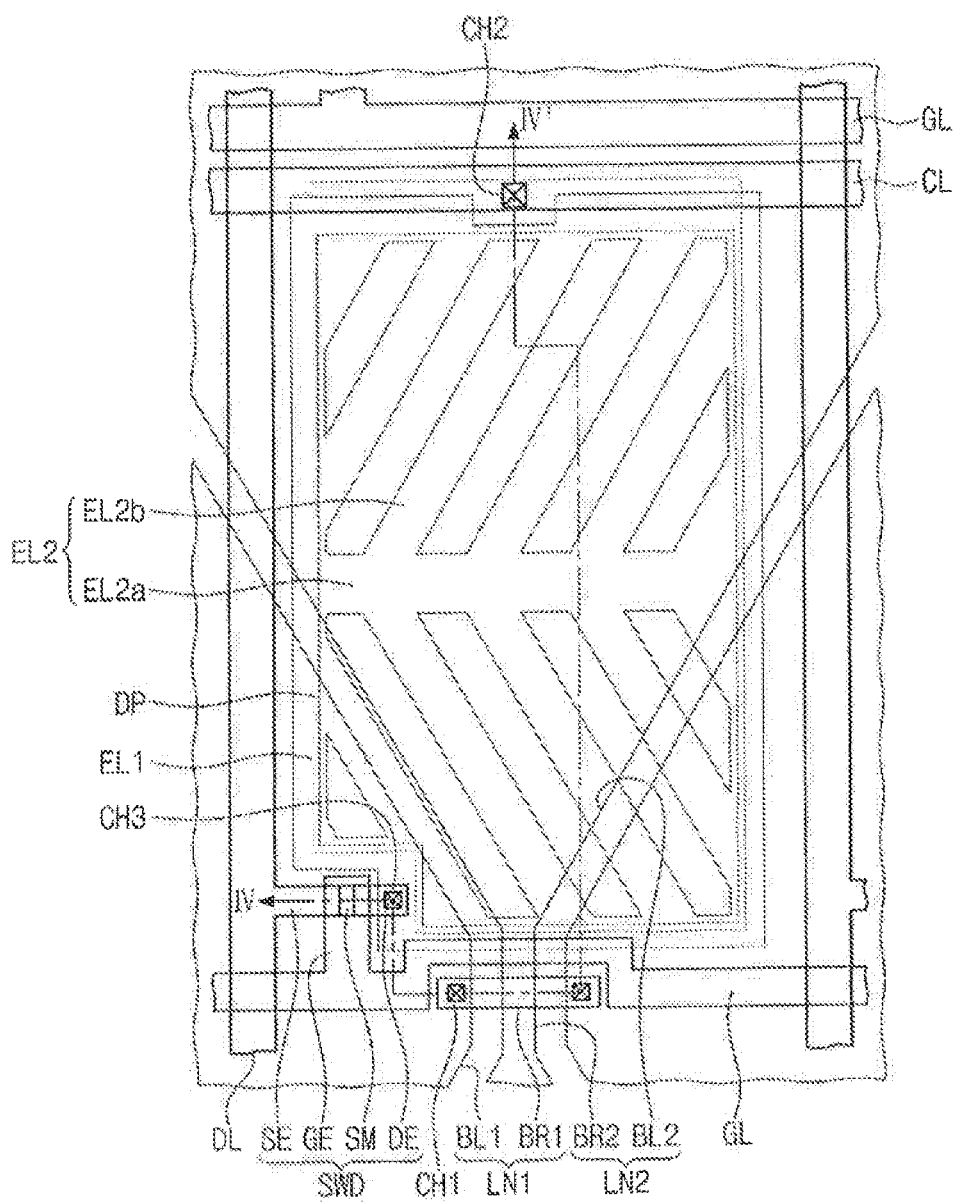
FIG. 20A is an enlarged plan view of FIG. 19B.
Figure 20B:
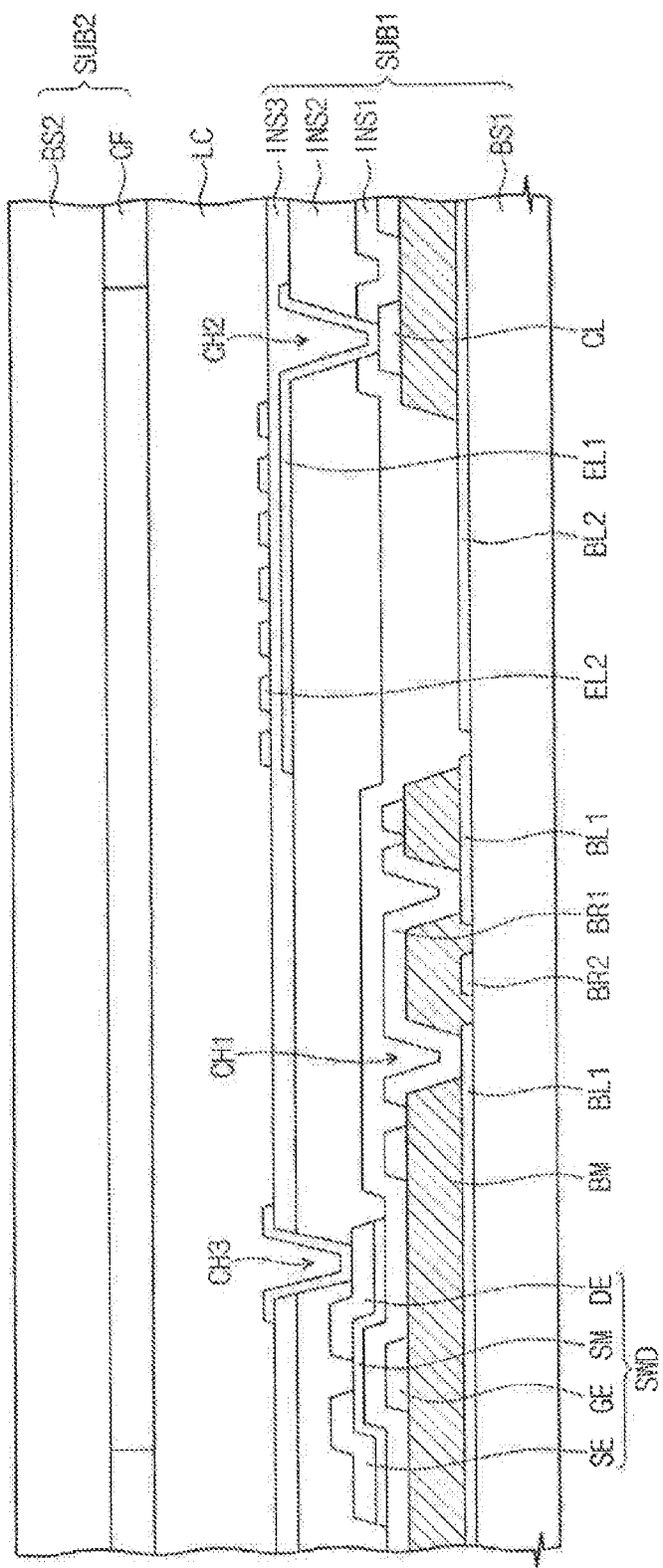
FIG. 20B is a cross-sectional view taken along a line IV-IV' of FIG. 20A.

FIG. 19A is a plan view showing a portion of a display apparatus according to an exemplary embodiment of the present invention, FIG. 19B is an enlarged plan view showing a pixel part of FIG. 19A, FIG. 20A is an enlarged plan view of FIG. 19B, and FIG. 20B is a cross-sectional view taken along a line IV-IV' of FIG. 20A In an exemplary embodiment, for convenience of description, a side, on which the touch event occurs and an image is displayed, is referred to as being in a lower direction of the display apparatus. According to an embodiment, a light source is provided above on an upper side of the display apparatus to provide light to the display apparatus.

Referring to FIGS. 19A, 19B, 20A, and 20B, the display apparatus according to an exemplary embodiment includes a plurality of pixels PXL arranged in a matrix form. In FIGS. 19A and 19B, for convenience of description, the pixels PXL are shown with a touch sensing part in the pixels PXL.

Each pixel PXL includes a display area DP in which the image is displayed and a non-display area NDP except for the display area DP when viewed in a plan view. Each pixel PXL includes a first substrate SUB1, a second substrate SUB2 facing the first substrate SUB1, a liquid crystal layer LC disposed between the first substrate SUB1 and the second substrate SUB2, and an electronic device that drives the liquid crystal layer LC. The non-display area NDP is disposed adjacent to at least one side of the display area DP, and according to an embodiment, surrounds the display area DP as shown in FIGS. 19A and 19B.

The first substrate SUB1 includes a first base substrate BS1, a touch sensing part disposed on the first base substrate BS1, a black matrix BM disposed on the first base substrate BS, and a signal line disposed on the black matrix BM to apply a driving signal to the electronic device.

The touch sensing part includes a plurality of first lines LN1 extended in a first direction and applied with an operating voltage and a plurality of second lines LN2 extended in a second direction different from the first direction and applied with a sensing voltage. The first lines LN1 are capacitively coupled with the second lines LN2, and the sensing voltage of the second lines LN2 is changed by the capacitive coupling between the first lines LN1 and the second lines LN2. Each of the first lines LN1 includes a plurality of first blocks BL1 arranged in the first direction and a plurality of first bridges BR1 each of which connects adjacent first blocks BL1 to each other. Each of the second lines LN2 includes a plurality of second blocks BL2 arranged in the second direction and a plurality of second bridges BR2 each of which connects adjacent second blocks BL2 to each other. The first blocks BL1 are alternately arranged with the second blocks BL2 in a matrix form on the first base substrate BS1.

According to an embodiment, the second blocks BL2 and the second bridges BR2 that form each second line LN2 are integrally formed with each other. The first blocks BL1, the second blocks BL2, and the second bridges BR2 are disposed on the first base substrate BS1. In each first line LN1, the first bridges BR1 are disposed on a different layer from the first blocks BL1.

The black matrix BM is disposed on the first blocks BL1, the second blocks BL2, and the second bridges BR2. Part of the black matrix BM is opened corresponding to the display area DP and is disposed in the non-display area NDP. The black matrix BM includes the area in which the signal line and the electronic device, e.g., the switching device SWD, are formed.

The first bridges BR2, the signal line, and the electronic device are disposed on the first base substrate BS1 on which the black matrix BM is formed. The first bridges BR1 are insulated from and cross the second bridges BR2 while the black matrix BM is disposed between the first bridges BR1 and the second bridges BR2.

The signal line includes a plurality of gate lines GL, a plurality of data lines DL, and a plurality of common lines CL. The electronic device includes the switching device SWD, a first electrode EL1, and a second electrode EL2.

The first bridges BR1, the gate lines GL, and the common lines CL are disposed on the black matrix BM corresponding to the non-display area NDP. Each gate line GL and each common line CL are extended in the first direction in which the first lines LN1 of the touch sensing part are extended, and the gate and common lines GL and CL are spaced apart from each other. In an exemplary embodiment, the gate lines GL are spaced apart from the first bridges BR1 when viewed in a plan view. The first bridges BR1 are in parallel or substantially in parallel with the extension direction of the gate lines GL. The gate lines GL are bent several times in the area in which the first bridges BR1 are formed to allow the gate lines GL not to overlap the first bridges BR1 when viewed in a plan view. However, the gate lines GL are substantially extended along the first direction. In an exemplary embodiment, the first bridges BR1 have a rectangular shape and are in parallel or substantially in parallel with the gate lines GL, but they should not be limited thereto or thereby. Alternatively, the first bridges BR1 have other shapes or other directions when the first bridges BR1 are disposed in the area, in which the gate lines GL are not formed in the non-display area NDP covered by the black matrix BM.

The black matrix BM includes first contact holes CH1 to expose portions of the first blocks BL1, and the first bridges BR1 connect adjacent first blocks BL1 to each other through the first contact hole CH1. In the black matrix BM, the first contact holes CH1 and the first bridges BR1 are disposed on the black matrix BM corresponding to the gate lines GL.

A first insulating layer INS1 is disposed on the first bridges BR1, the gate lines GL, and the common lines CL.

The data lines DL are extended in the second direction in which the second lines LN2 of the touch sensing part are extended. The data lines DL are insulated from the gate lines GL and the common lines CL while the first insulating layer INS1 is disposed between the data lines DL and the gate and common lines GL and CL.

The switching device SWD is connected to a corresponding gate line of the gate lines GL and a corresponding data line of the data lines DL. The switching device SWD includes a gate electrode GE, a semiconductor layer SM, a source electrode SE, and a drain electrode DE.

A second insulating layer INS2 is disposed on the first insulating layer INS1 and covers the switching device SWD.

The first electrode EL1 is disposed on the second insulating layer INS2. The first insulating layer INS1 and the second insulating layer INS2 are provided with a second contact hole CH2 formed therethrough. The second contact hole CH2 exposes a portion of the common line CL. The first electrode EL1 is connected to the common line CL through the second contact hole CH2. According to an embodiment, the first electrode EL1 is provided as a single plate and disposed in the display area DP.

A third insulating layer INS3 is disposed on the first base substrate BS1 on which the first electrode EL1 is disposed, and the second electrode EL2 is disposed on the third insulating layer INS3. The second and third insulating layers INS2 and INS3 are provided with a third contact hole CH3 formed therethrough. The third contact hole CH3 exposes a portion of the drain electrode DE. The second electrode EL2 is connected to the drain electrode DE through the third contact hole CH3. The second electrode EL2 overlaps the first electrode EL1.

The second substrate SUB2 includes a second base substrate BS2 and color filters CF disposed on the second base substrate BS2. The color filters CF allow light passing through the liquid crystal layer LC to have colors.

The liquid crystal layer LC including liquid crystal molecules is disposed between the first substrate SUB1 and the second substrate SUB2.

According to an exemplary embodiment, since the first bridges and the data line part are formed once through the single mask process when the touch sensing part and the signal line are formed, manufacturing time and cost of the display apparatus may be reduced. The area of the display area may be increased since the first bridges are formed in the area that is covered by the black matrix and in which the gate lines GL or the switching device SWD are not formed.

Figure 21:
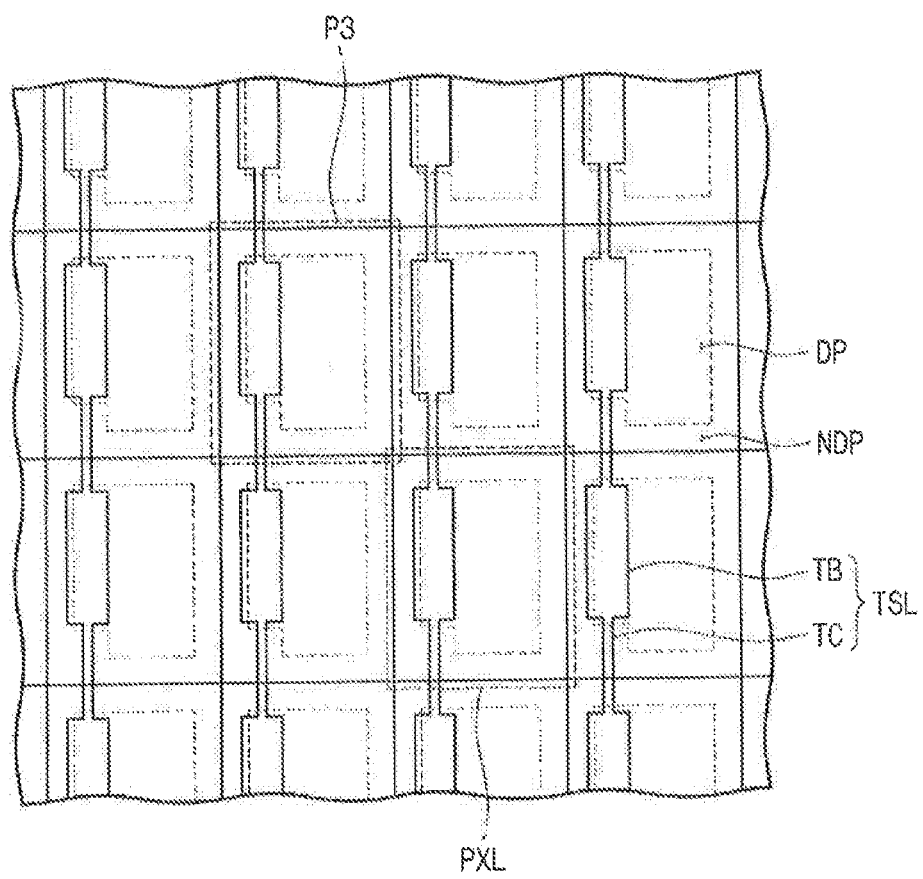
FIG. 21 is a plan view showing a portion of a display apparatus according to an exemplary embodiment of the present invention.
Figure 22A:
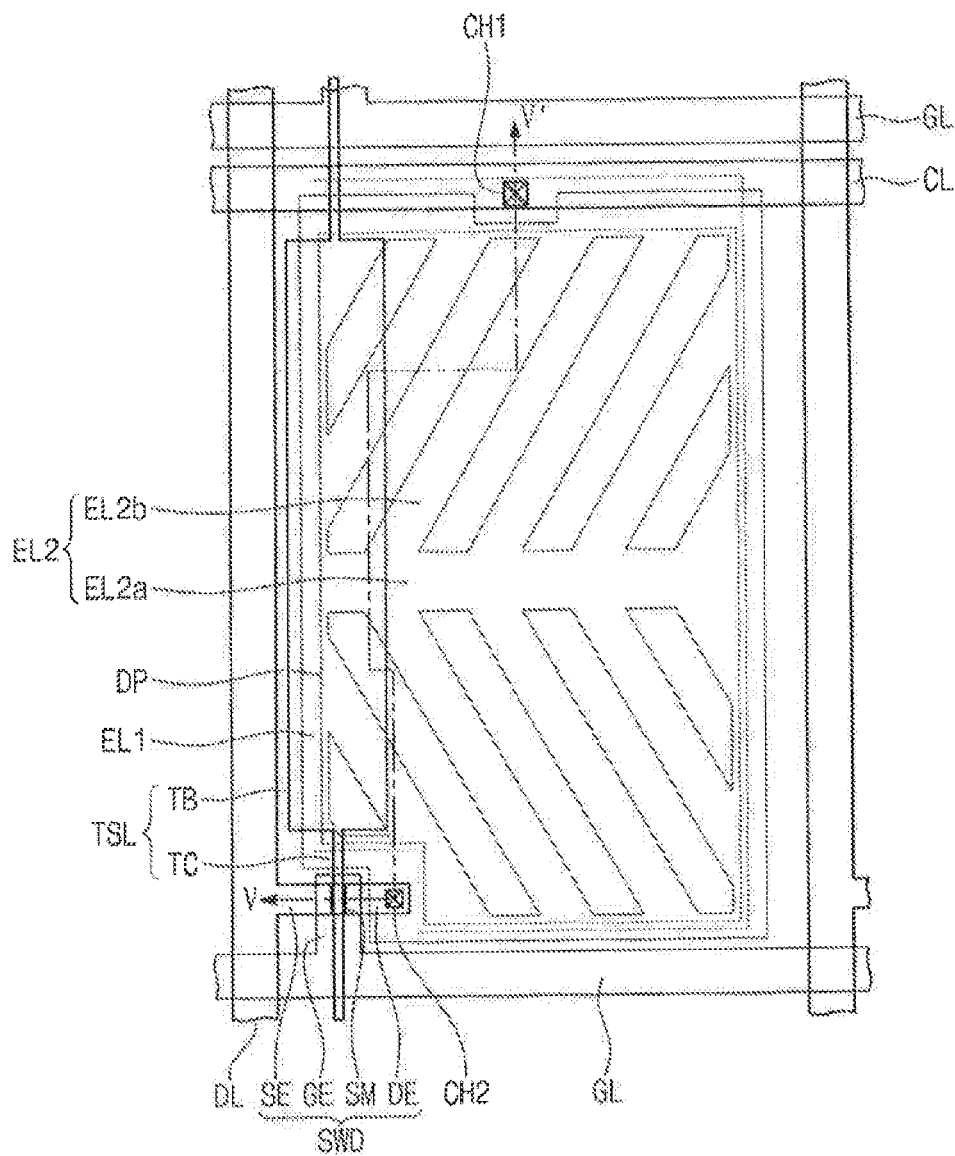
FIG. 22A is an enlarged view showing a portion P3 of FIG. 21.
Figure 22B:
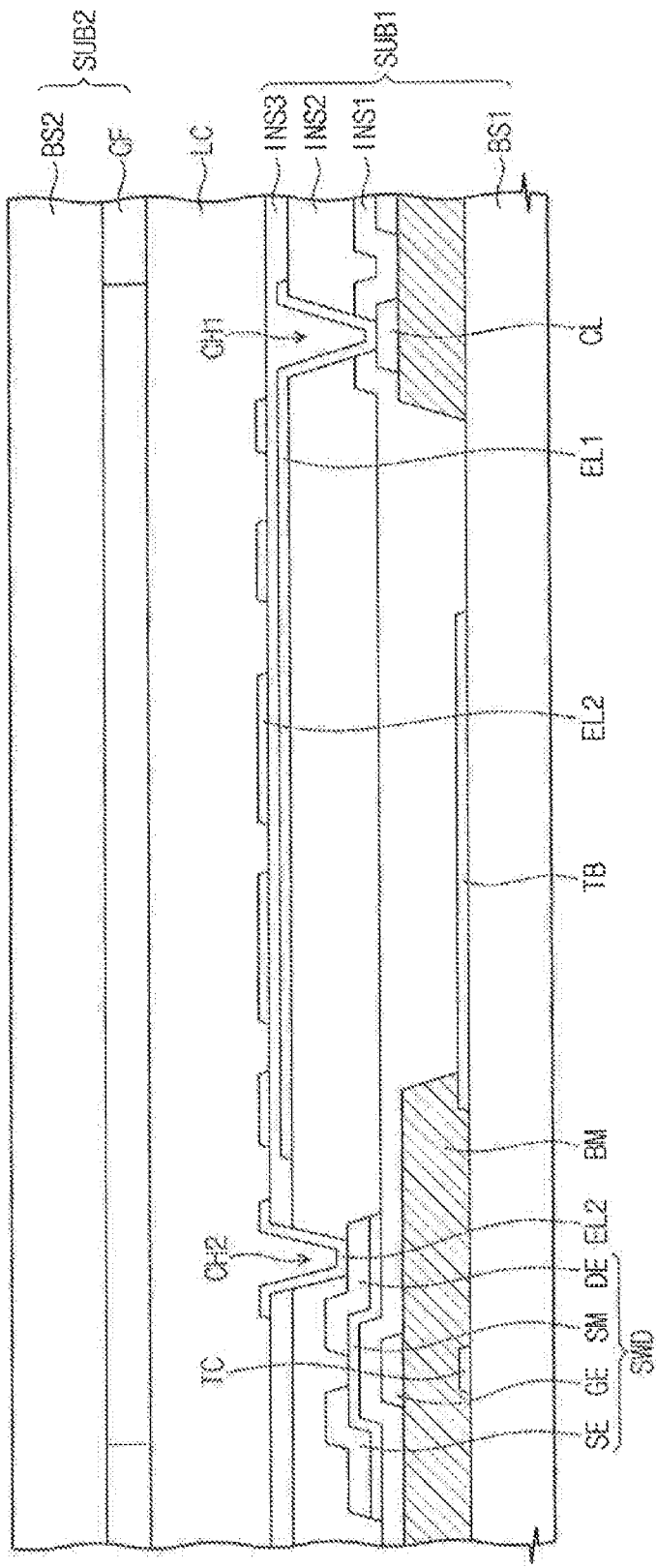
FIG. 22B is a cross-sectional view taken along a line V-V' of FIG. 22A.

FIG. 21 is a plan view showing a portion of a display apparatus according to an exemplary embodiment of the present invention, FIG. 22A is an enlarged view showing a portion P3 of FIG. 21, and FIG. 22B is a cross-sectional view taken along a line V-V' of FIG. 22A.

In an exemplary embodiment, for convenience of description, a side, on which the touch event occurs and an image is displayed, is referred to as being in a lower direction of the display apparatus. According to an embodiment, a light source is provided on an upper side of the display apparatus to provide light to the display apparatus.

Referring to FIGS. 21, 22A, and 22B, the display apparatus according to an exemplary embodiment includes a plurality of pixels PXL arranged in a matrix form. In FIG. 21, for convenience of description, the pixels PXL are shown with a touch sensing part in the pixels PXL.

Each pixel PXL includes a display area DP in which the image is displayed and a non-display area NDP except for the display area DP when viewed in a plan view. Each pixel PXL includes a first substrate SUB1, a second substrate SUB2 facing the first substrate SUB1, a liquid crystal layer LC disposed between the first substrate SUB1 and the second substrate SUB2, and an electronic device that drives the liquid crystal layer LC. The non-display area NDP is disposed adjacent to at least one side of the display area DP, and according to an embodiment, surrounds the display area DP as shown in FIGS. 19A and 19B.

The first substrate SUB1 includes a first base substrate BS1, a touch sensing part disposed on the first base substrate BS1, a black matrix BM disposed on the first base substrate BS, and a signal line disposed on the black matrix BM to apply a driving signal to the electronic device.

The touch sensing part senses a touch event occurring on the display apparatus by a user's finger or separate input devices. In an exemplary embodiment, the touch sensing part is operated in a capacitive mode.

The touch sensing part includes a plurality of touch sensing lines TSL to which is applied a sensing voltage. Each of the touch sensing lines TSL includes a plurality of touch blocks TB and a plurality of connection bridges TC each of which connects adjacent touch blocks TB to each other. In each touch sensing line TSL, part of the connection bridges TC overlaps a gate electrode GE or/and a gate line GL and is capacitively coupled with the gate electrode GE or/and the gate line GL. According to an embodiment, the touch sensing lines TSL are extended in a direction crossing a direction in which the gate line GL is extended.

The black matrix BM is disposed in the non-display area NDP, and part of the black matrix BM overlaps the touch sensing lines TSL when viewed in a plan view.

The signal line and the electronic device are disposed on the first base substrate BS1 on which the black matrix BM is provided. The signal line includes a plurality of gate lines GL, a plurality of data lines DL, and a plurality of common lines CL. The electronic device includes a switching device SWD, a first electrode EL1, and a second electrode EL2.

The gate lines GL and the common lines CL are disposed on the black matrix BM corresponding to the non-display area NDP. Each gate line GL and each common line CL are extended in the first direction and spaced apart from each other. A first insulating layer INS1 is disposed on the gate lines GL and the common lines CL. The data lines DL are disposed on the first insulating layer INS1 to correspond to the non-display area NDP. The data lines DL are extended in the second direction crossing the first direction. The data lines DL are insulated from the gate lines GL and the common lines CL while the first insulating layer INS1 is disposed between the data lines DL and the gate and common lines GL and CL. The touch sensing lines TSL are extended in the direction in which the data lines DL are extended, e.g., the second direction.

The switching device SWD is connected to a corresponding gate line of the gate lines GL and a corresponding data line of the data lines DL. The switching device SWD includes a gate electrode GE, a semiconductor layer SM, a source electrode SE, and a drain electrode DE.

The gate electrode GE is branched from a corresponding gate line GL and overlaps a corresponding connection bridge TC of the connection bridges TC of the touch sensing line TSL. The semiconductor layer SM is disposed above the gate electrode GE and overlaps the gate electrode GE when viewed in a plan view. The source electrode SE is branched from the data line DL.

A second insulating layer INS2 is disposed on the first insulating layer INS and covers the switching device SWD.

The first electrode EL1 is disposed on the second insulating layer INS2. The first insulating layer INS1 and the second insulating layer INS2 are provided with a first contact hole CH1 formed therethrough. The first contact hole CH1 exposes a portion of the common line CL. The first electrode EL1 is connected to the common line CL through the first contact hole CH1. According to an embodiment, the first electrode EL1 is provided as a single plate and disposed in the display area DP.

A third insulating layer INS3 is disposed on the first base substrate BS1 on which the first electrode EL1 is disposed and the second electrode EL2 is disposed on the third insulating layer INS3. The second and third insulating layers INS2 and INS3 are provided with a second contact hole CH2 formed therethrough. The second contact hole CH2 exposes a portion of the drain electrode DE. The second electrode EL2 is connected to the drain electrode DE through the second contact hole CH2.

The second substrate SUB2 includes a second base substrate BS2 and color filters CF disposed on the second base substrate BS2. The color filters CF allow the light passing through the liquid crystal layer LC to have colors.

The liquid crystal layer LC including liquid crystal molecules is disposed between the first substrate SUB1 and the second substrate SUB2.

In an exemplary embodiment, although not shown in figures, the touch sensing lines TSL further include a sensing unit (not shown) protruded from the touch sensing lines TSL and extended in the first direction in which the gate lines GL are extended, and thus a touch sensitivity of the touch sensing lines TSL may be increased.

The touch sensing lines TSL are capacitively coupled with the gate line GL and/or the gate electrode GE, and a voltage of the touch sensing lines TSL is changed by the capacitive coupling between the touch sensing lines TSL and the gate line GL and/or the gate electrode GE. According to an embodiment, a controller is provided to apply a sensing input signal to the touch sensing lines TSL and the gate lines GL and/or the gate electrode GE or to detect a sensing output signal from the gate lines GL and/or the gate electrode GE and the touch sensing lines TSL.

The touch sensing part having the above-described structure is charged with electric charges in accordance with the sensing input signal from the controller. When the touch event occurs on the external surface of the first base substrate BS1 by the user, the capacitance of the touch sensing lines TSL and the gate lines GL and/or the gate electrodes GE is changed, the sensing signal according to the capacitance is output, and the sensing signal is analyzed by the controller, to thereby figure out the touch position.

According to an exemplary embodiment, the display apparatus may prevent the display disturbance from occurring and the external light from being reflected by the signal line, to thereby increase display quality. Since the touch sensing part is formed by using the gate line and/or the gate electrode, a process of forming the touch sensing part may be simplified.

Figure 23A:
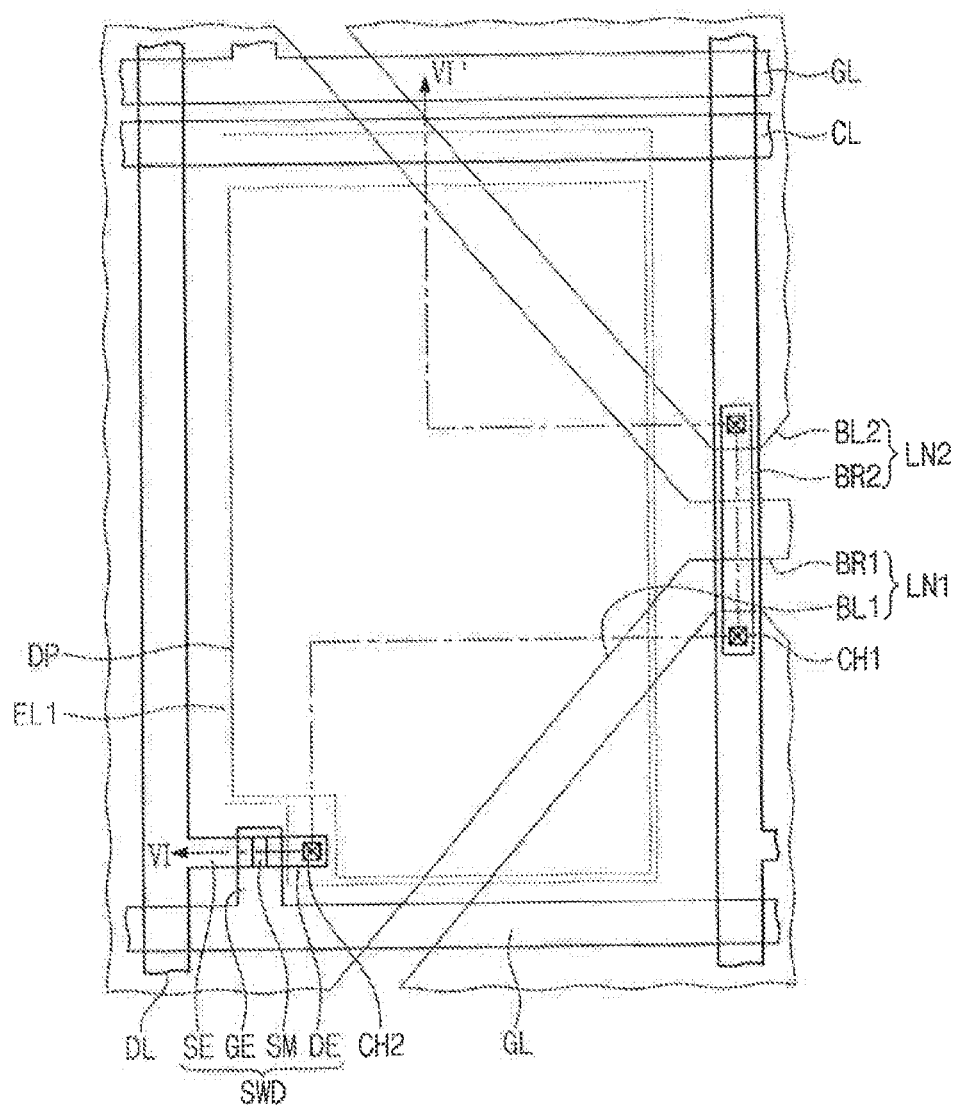
FIG. 23A is a plan view showing a display apparatus according to an exemplary embodiment of the present invention.
Figure 23B:
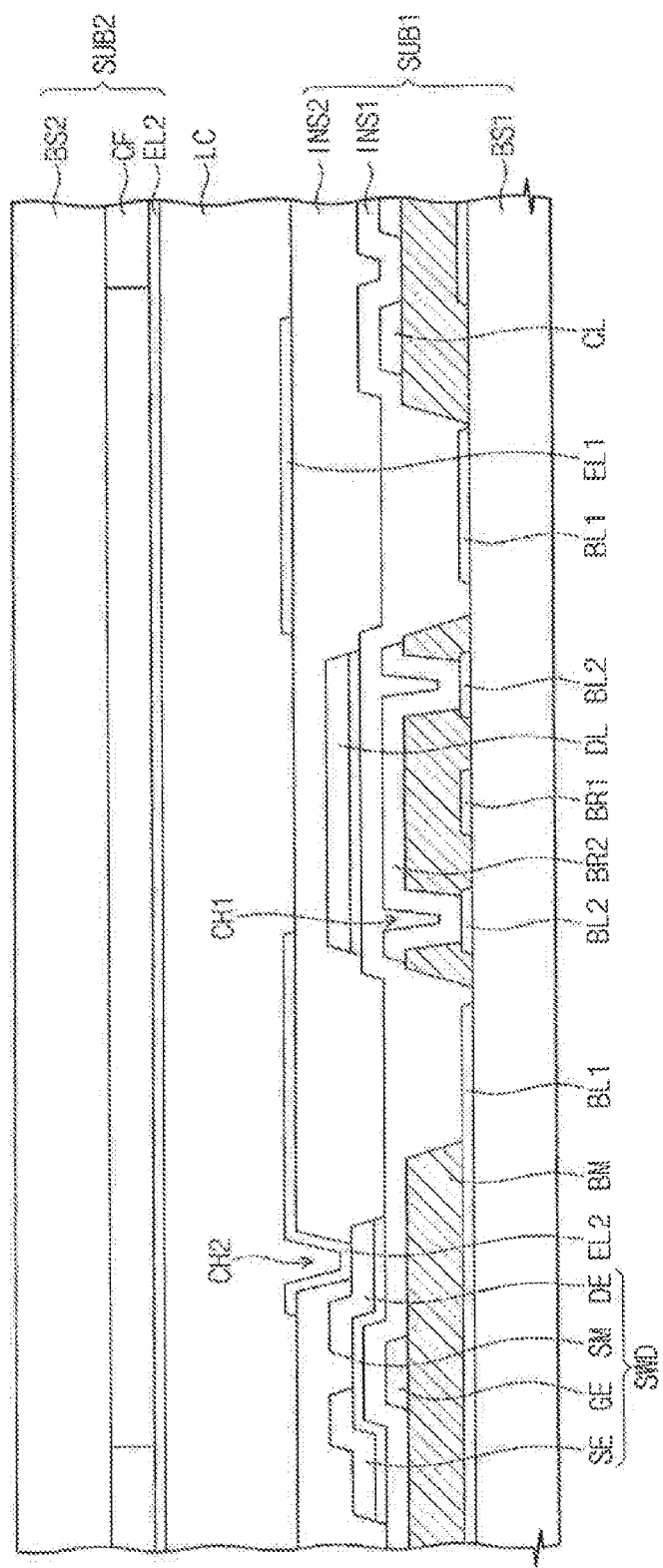
FIG. 23B is a cross-sectional view taken along a line VI-VI' of FIG. 23A.

FIG. 23A is a plan view showing a display apparatus according to an exemplary embodiment of the present invention and FIG. 23B is a cross-sectional view taken along a line VI-VI' of FIG. 23A.

Referring to FIGS. 23A and 23B, each pixel PXL includes a display area DP in which an image is displayed and a non-display area NDP except for the display area DP when viewed in a plan view. Each pixel PXL includes a first substrate SUB1, a second substrate SUB2 facing the first substrate SUB1, a liquid crystal layer LC disposed between the first substrate SUB1 and the second substrate SUB2, and an electronic device that drives the liquid crystal layer LC.

The first substrate SUB1 includes a first base substrate BS1, a touch sensing part disposed on the first base substrate BS1, a black matrix BM disposed on the first base substrate BS1, and a signal line disposed on the black matrix BM to apply a driving signal to the electronic device.

The touch sensing part includes a plurality of first lines LN1 extended in a first direction and applied with an operating voltage and a plurality of second lines LN2 extended in a second direction, different from the first direction and applied with a sensing voltage. The first lines LN1 are capacitively coupled with the second lines LN2, and the sensing voltage of the second lines LN2 is changed by the capacitive coupling between the first lines LN1 and the second lines LN2. Each of the first lines LN1 includes a plurality of first blocks BL1 arranged in the first direction and a plurality of first bridges BR1 each of which connects adjacent first blocks BL1 to each other. Each of the second lines LN2 includes a plurality of second blocks BL2 arranged in the second direction and a plurality of second bridges BR2 each of which connects adjacent second blocks BL2 to each other. The first blocks BL1, the first bridges BR1, and the second blocks BL2 are disposed on the first base substrate BS1, and a first insulating layer INS1 is disposed on the first blocks BL1, the first bridges BR1, and the second blocks BL2. The first insulating layer INS1 is provided with first contact holes CH1 formed therethrough. The first contact holes CH1 expose a portion of the second blocks BL2. The second bridges BR2 connect adjacent second blocks BL2 to each other through the first contact holes CH1.

The second substrate SUB2 includes a second base substrate BS2 and color filters CF disposed on the second base substrate BS2. The color filters CF allow the light passing through the liquid crystal layer LC to have colors.

The electronic device includes a switching device SWD, a first electrode EL1, and a second electrode EL2. The switching device SWD and the first electrode EL1 of the electronic device are disposed on the first base substrate BS1, and the second electrode EL2 of the electronic device is disposed on the second base substrate BS2.

The gate lines GL and the common lines CL are disposed on the black matrix BM corresponding to the non-display area NDP. Each gate line GL and each common line CL are extended in the first direction and spaced apart from each other. The first insulating layer INS1 is disposed on the gate lines GL and the common lines CL. The data lines DL are disposed on the first insulating layer INS1 to correspond to the non-display area NDP. The data lines DL are extended in the second direction crossing the first direction. The data lines DL are insulated from the gate lines GL and the common lines CL while the first insulating layer INS1 is disposed between the data lines DL and the gate and common lines GL and CL.

The switching device SWD is connected to a corresponding gate line of the gate lines GL and a corresponding data line of the data lines DL. The switching device SWD includes a gate electrode GE, a semiconductor layer SM, a source electrode SE, and a drain electrode DE.

The gate electrode GE is branched from a corresponding gate line GL. The semiconductor layer SM is provided on the first insulating layer INS1 in a thin layer shape. The semiconductor layer SM is disposed above the gate electrode GE and overlaps the gate electrode GE when viewed in a plan view. The source electrode SE is branched from the data line DL.

A second insulating layer INS2 is disposed on the first insulating layer INS1 and covers the switching device SWD. The first insulating layer INS1 and the second insulating layer INS2 are provided with a second contact hole CH2 formed therethrough. The second contact hole CH2 exposes a portion of the drain electrode DE of the switching device SWD. The first electrode EL1 is connected to the drain electrode DE through the second contact hole CH2.

The second electrode EL2 is disposed on the color filters CF of the second substrate SUB2. The second electrode EL2 faces the first electrode EL1 while the liquid crystal layer LC is provided between the first and second electrodes EL1 and EL2.

The liquid crystal layer LC including liquid crystal molecules is disposed between the first substrate SUB1 and the second substrate SUB2.

According to an embodiment, the first electrode EL1 and/or the second electrode EL2 are formed as a single plate. According to an embodiment, a domain divider is provided to the first electrode EL1 and/or the second electrode EL2 to form a plurality of domains that control the liquid crystal layer LC. For instance, according to an embodiment, the first electrode EL1 and/or the second electrode EL2 include a plurality of slits or protrusions. According to an embodiment, the first electrode EL1 includes a plurality of fine slits to allow the first electrode EL1 to include a plurality of branches.

According to an exemplary embodiment, the display apparatus may prevent the display disturbance from occurring and external light from being reflected by the signal line in a twisted nematic mode display apparatus or a vertical alignment mode display apparatus in which electrodes are respectively formed on first and second substrates, thereby increasing display quality.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:
1. A display apparatus comprising:
a first base substrate;
a touch sensing part on the first base substrate;
an electronic device on the first base substrate;
a black matrix on the first base substrate;
a signal line on the black matrix;
a second base substrate facing the first base substrate; and
a liquid crystal layer between the first base substrate and the second base substrate, wherein the electronic device comprises:
  a first electrode;
  a second electrode configured to form an electric field in the liquid crystal layer in cooperation with the first electrode; and
  a switching device connected to the first electrode,
wherein the touch sensing part comprises:
  a plurality of first lines extended in a first direction, the plurality of first lines configured to receive an operating voltage; and
  a plurality of second lines extended in a second direction different from the first direction, the plurality of second lines configured to receive a sensing voltage,
wherein the second lines are capacitively coupled to the first lines,
wherein the sensing voltage is changed by the capacitive coupling between the first and second lines,
wherein at least one of the first lines comprises a plurality of first blocks arranged in the first direction and a plurality of first bridges, at least one of the first bridges connecting adjacent first blocks to each other,
wherein at least one of the second lines comprises a plurality of second blocks arranged in the second direction and a plurality of second bridges, at least one of the second bridges connecting adjacent second blocks to each other,
wherein the first bridges are insulated from and cross the second bridges, and
wherein the black matrix is disposed between the first and second bridges, the black matrix being in direct contact with the first bridges and the second bridges.

2. The display apparatus of claim 1,
wherein the black matrix is further in direct contact with the first and second blocks.

3. The display apparatus of claim 1,
wherein the switching device comprises:
a gate electrode on the black matrix;
a source electrode, a portion of the source electrode overlapping the gate electrode wherein a first insulating layer is disposed between the source electrode and the gate electrode; and
a drain electrode spaced apart from the source electrode, a portion of the drain electrode overlapping the gate electrode wherein the first insulating layer is disposed between the drain electrode and the gate electrode, the drain electrode being connected to the first electrode.

4. The display apparatus of claim 3,
wherein the signal line comprises a plurality of gate lines extended in the first direction and configured to apply a gate signal to the gate electrode and a plurality of data lines extended in the second direction and configured to apply a data signal to the source electrode.

5. The display apparatus of claim 4, further comprising:
contact holes provided in the black matrix, the contact holes penetrating through the black matrix to expose a portion of the second blocks,
wherein the second bridges are connected to the second blocks through the contact holes.

6. The display apparatus of claim 5,
wherein the contact holes overlap at least one of the data lines.

7. The display apparatus of claim 6,
wherein the black matrix has a first width in an area in which the contact holes are provided, and a second width in an area in which no contact hole is provided, and
wherein the first width is greater than the second width.

8. The display apparatus of claim 4, further comprising one or more switching devices, the switching devices respectively corresponding to the gate lines and the data lines, and wherein at least one of the first blocks and the second blocks overlapping at least one switching device when viewed in a plan view.

* * * * *